United States Patent
Akimoto et al.

(10) Patent No.: US 9,349,874 B2
(45) Date of Patent: *May 24, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Kengo Akimoto, Atsugi (JP); Toshinari Sasaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/278,521

(22) Filed: May 15, 2014

(65) Prior Publication Data

US 2014/0246673 A1    Sep. 4, 2014

Related U.S. Application Data

(63) Continuation of application No. 13/688,598, filed on Nov. 29, 2012, now Pat. No. 8,759,167, which is a continuation of application No. 12/604,622, filed on Oct. 23, 2009, now Pat. No. 8,426,868.

(30) Foreign Application Priority Data

Oct. 31, 2008   (JP) .................................. 2008-281174

(51) Int. Cl.
   *H01L 21/48*    (2006.01)
   *H01L 29/786*   (2006.01)
(Continued)

(52) U.S. Cl.
   CPC .......... *H01L 29/78693* (2013.01); *H01L 29/45* (2013.01); *H01L 29/66969* (2013.01);
(Continued)

(58) Field of Classification Search
   CPC ..................... H01L 29/7869; H01L 29/78696; H01L 29/78693; H01L 29/66969
   USPC ............ 257/72, 89, 92, E21.426, 29.226, 276
   See application file for complete search history.

(56) References Cited

U.S. PATENT DOCUMENTS

| 5,648,293 A | 7/1997 | Hayama et al. |
| 5,731,856 A | 3/1998 | Kim et al. |

(Continued)

FOREIGN PATENT DOCUMENTS

| CN | 101183667 A | 5/2008 |
| EP | 1737044 A | 12/2006 |

(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Michael Lebentritt
(74) *Attorney, Agent, or Firm* — Eric J. Robinson; Robinson Intellectual Property Law Office, P.C.

(57) ABSTRACT

An object is to improve field effect mobility of a thin film transistor using an oxide semiconductor. Another object is to suppress increase in off current even in a thin film transistor with improved field effect mobility. In a thin film transistor using an oxide semiconductor layer, by forming a semiconductor layer having higher electrical conductivity and a smaller thickness than the oxide semiconductor layer between the oxide semiconductor layer and a gate insulating layer, field effect mobility of the thin film transistor can be improved, and increase in off current can be suppressed.

31 Claims, 29 Drawing Sheets

(51) Int. Cl.
*H01L 29/45* (2006.01)
*H01L 29/66* (2006.01)
*H01L 27/12* (2006.01)

(52) U.S. Cl.
CPC ...... *H01L29/7869* (2013.01); *H01L 29/78696* (2013.01); *H01L 27/1225* (2013.01); *H01L 29/66742* (2013.01)

(56) References Cited

U.S. PATENT DOCUMENTS

| | | |
|---|---|---|
| 5,744,864 A | 4/1998 | Cillessen et al. |
| 5,847,410 A | 12/1998 | Nakajima |
| 6,197,625 B1 | 3/2001 | Choi |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,762,082 B2 | 7/2004 | Yamazaki et al. |
| 6,806,495 B1 | 10/2004 | Yamazaki et al. |
| 6,838,308 B2 | 1/2005 | Haga |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,670 B2 | 10/2009 | Kumaki et al. |
| 7,601,984 B2 | 10/2009 | Sano et al. |
| 7,674,650 B2 | 3/2010 | Akimoto et al. |
| 7,705,354 B2 | 4/2010 | Yamazaki et al. |
| 7,732,819 B2 | 6/2010 | Akimoto et al. |
| 7,772,021 B2 | 8/2010 | Lee et al. |
| 7,884,360 B2 | 2/2011 | Takechi et al. |
| 7,960,730 B2 | 6/2011 | Lee et al. |
| 7,973,312 B2 | 7/2011 | Yamazaki et al. |
| 7,977,255 B1 | 7/2011 | Scheer et al. |
| 7,994,500 B2 | 8/2011 | Kim et al. |
| 8,058,645 B2 | 11/2011 | Jeong et al. |
| 8,058,647 B2 | 11/2011 | Kuwabara et al. |
| 8,143,678 B2 | 3/2012 | Kim et al. |
| 8,148,779 B2 | 4/2012 | Jeong et al. |
| 8,178,926 B2 | 5/2012 | Nakayama |
| 8,188,478 B2 | 5/2012 | Yamazaki et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,344,387 B2 | 1/2013 | Akimoto et al. |
| 8,420,442 B2 | 4/2013 | Takechi et al. |
| 8,558,323 B2 | 10/2013 | Kim et al. |
| 8,633,492 B2 * | 1/2014 | Akimoto et al. ............... 257/72 |
| 9,099,355 B2 | 8/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0023432 A1 | 2/2004 | Haga |
| 2004/0038446 A1 | 2/2004 | Takeda et al. |
| 2004/0127038 A1 | 7/2004 | Carcia et al. |
| 2004/0188685 A1 | 9/2004 | Lin et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0254456 A1 | 11/2007 | Maruyama et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0179598 A1 | 7/2008 | Kim et al. |
| 2008/0182358 A1 | 7/2008 | Cowdery-Corvan et al. |
| 2008/0191204 A1 | 8/2008 | Kim et al. |
| 2008/0203387 A1 | 8/2008 | Kang et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045399 A1 | 2/2009 | Kaji et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |

(56) References Cited

U.S. PATENT DOCUMENTS

| | | |
|---|---|---|
| 2010/0073268 A1 | 3/2010 | Matsunaga et al. |
| 2010/0117078 A1 | 5/2010 | Kuwabara et al. |
| 2010/0117999 A1 | 5/2010 | Matsunaga et al. |
| 2010/0133530 A1 | 6/2010 | Akimoto et al. |
| 2010/0140599 A1 | 6/2010 | Yano et al. |
| 2010/0155716 A1 | 6/2010 | Cheong et al. |
| 2010/0181565 A1 | 7/2010 | Sakata et al. |
| 2010/0219410 A1 | 9/2010 | Godo et al. |
| 2010/0244020 A1 | 9/2010 | Sakata et al. |
| 2011/0042669 A1 | 2/2011 | Kim et al. |
| 2011/0049508 A1 | 3/2011 | Kawamura et al. |
| 2011/0193083 A1 | 8/2011 | Kim et al. |
| 2013/0001545 A1 | 1/2013 | Kuwabara et al. |
| 2013/0078762 A1 | 3/2013 | Akimoto et al. |
| 2013/0082255 A1 | 4/2013 | Akimoto et al. |
| 2013/0087785 A1 | 4/2013 | Akimoto et al. |
| 2013/0153892 A1 | 6/2013 | Sasaki et al. |
| 2013/0237012 A1 | 9/2013 | Takechi et al. |
| 2013/0285052 A1 | 10/2013 | Sakata et al. |

FOREIGN PATENT DOCUMENTS

| | | |
|---|---|---|
| EP | 1770788 A | 4/2007 |
| EP | 1950804 A | 7/2008 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-160170 A | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 07-045833 A | 2/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-250953 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-304140 A | 10/2004 |
| JP | 2006-106110 A | 4/2006 |
| JP | 2006-165527 A | 6/2006 |
| JP | 2007-073697 A | 3/2007 |
| JP | 2007-096055 A | 4/2007 |
| JP | 2007-123861 A | 5/2007 |
| JP | 2007-150158 A | 6/2007 |
| JP | 2007-173489 A | 7/2007 |
| JP | 2007-250983 A | 9/2007 |
| JP | 2007-318105 A | 12/2007 |
| JP | 2008-042088 A | 2/2008 |
| JP | 2008-199005 A | 8/2008 |
| JP | 2008-243929 A | 10/2008 |
| JP | 2008-276212 A | 11/2008 |
| JP | 2009-021554 A | 1/2009 |
| KR | 2008-0048936 A | 6/2008 |
| KR | 2008-0070313 A | 7/2008 |
| KR | 2008-0074515 A | 8/2008 |
| KR | 2008-0087744 A | 10/2008 |
| WO | WO-2004/114391 | 12/2004 |
| WO | WO-2007/119386 | 10/2007 |
| WO | WO-2008/126883 | 10/2008 |
| WO | WO-2008/126884 | 10/2008 |
| WO | WO-2009/034953 | 3/2009 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World'S Largest (15-Inch) XGA AMLCD Panel Using IGZO Oxide TFT", SID Digest '08 : SID International Symposium Digest of Technical Papers, May 20, 2008, vol. 39,pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium—Gallium—Zinc Oxide TFTs Array", SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", Journal of the SID, 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol 14, No. 3, pp. 911-916.
Costello.M at al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nakamura.M, "Synthesis of Homologous Compound with New Long-Period Structure", Nirim Newsletter, Mar. 1, 1995, vol. 150, pp. 1-4.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Korean Office Action (Application No. 2013-0000102) Dated Nov. 22, 2013.

Korean Office Action (Application No. 2013-0000107) Dated Nov. 22, 2013.

Chinese Office Action (Application No. 201210557121.7) Dated Jan. 7, 2015.

Korean Office Action (Application No. 2014-0134912) Dated Aug. 20, 2015.

Japanese Office Action (Appication No. 2014-072374) Dated Oct. 27, 2015.

* cited by examiner

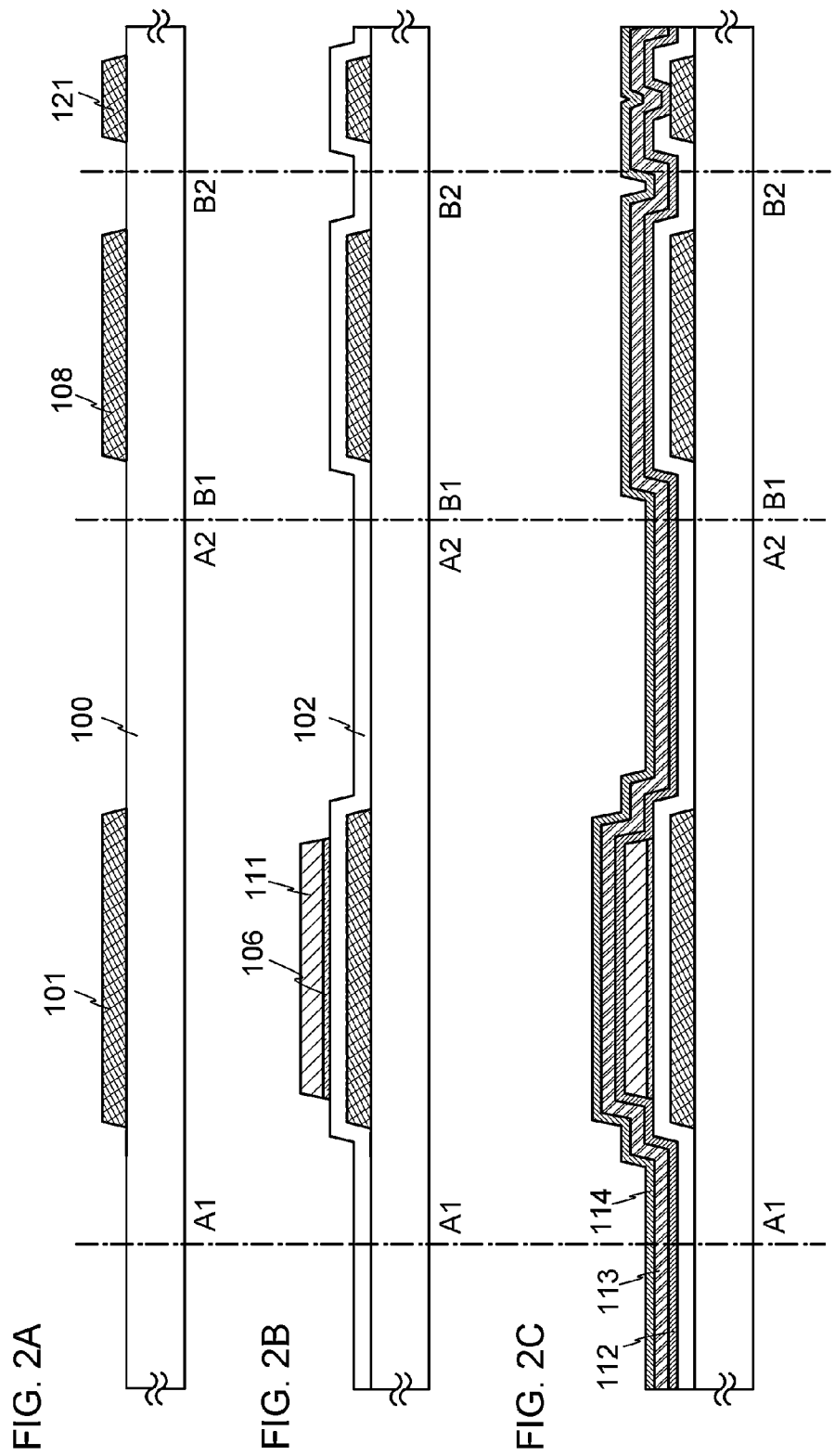

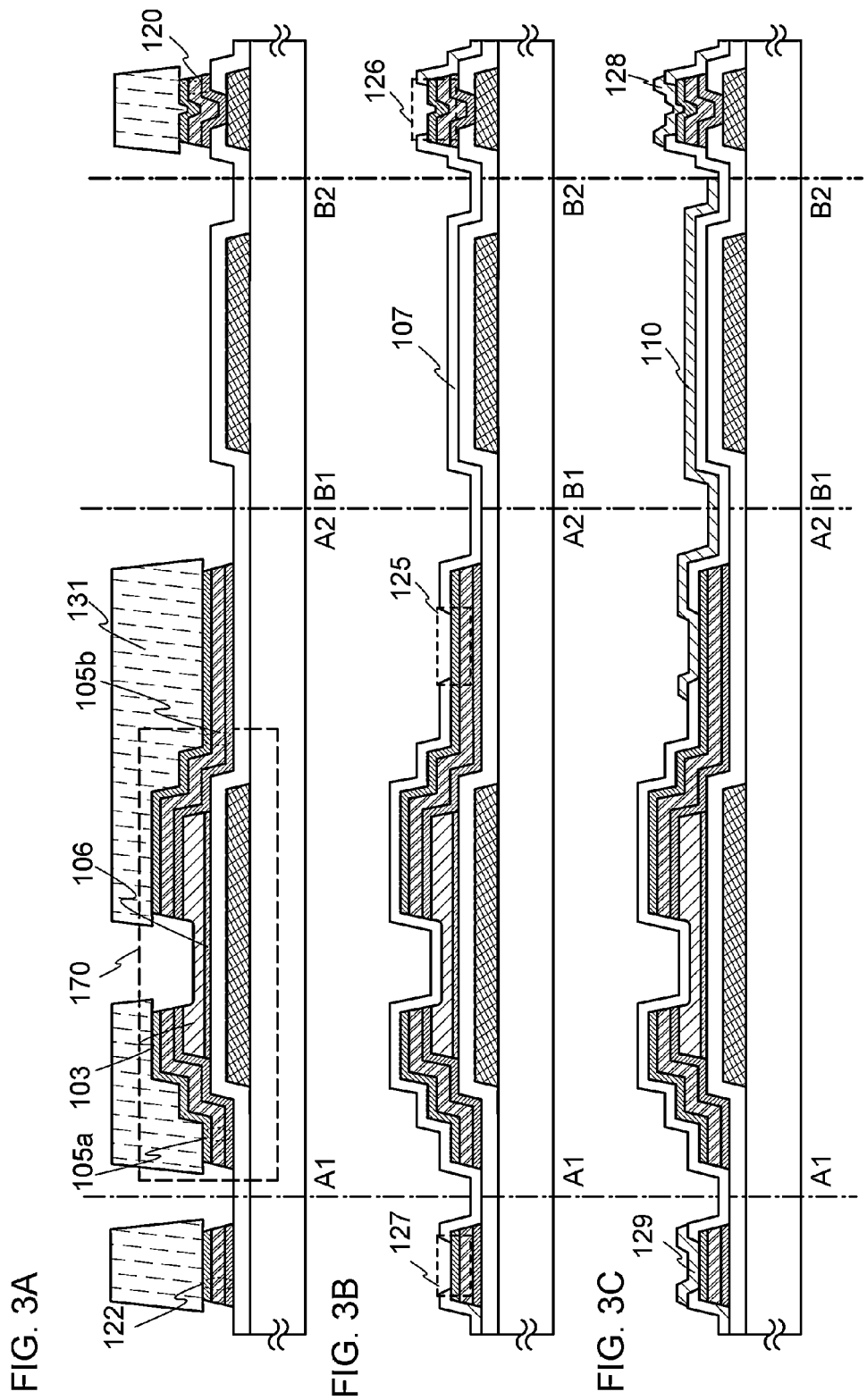

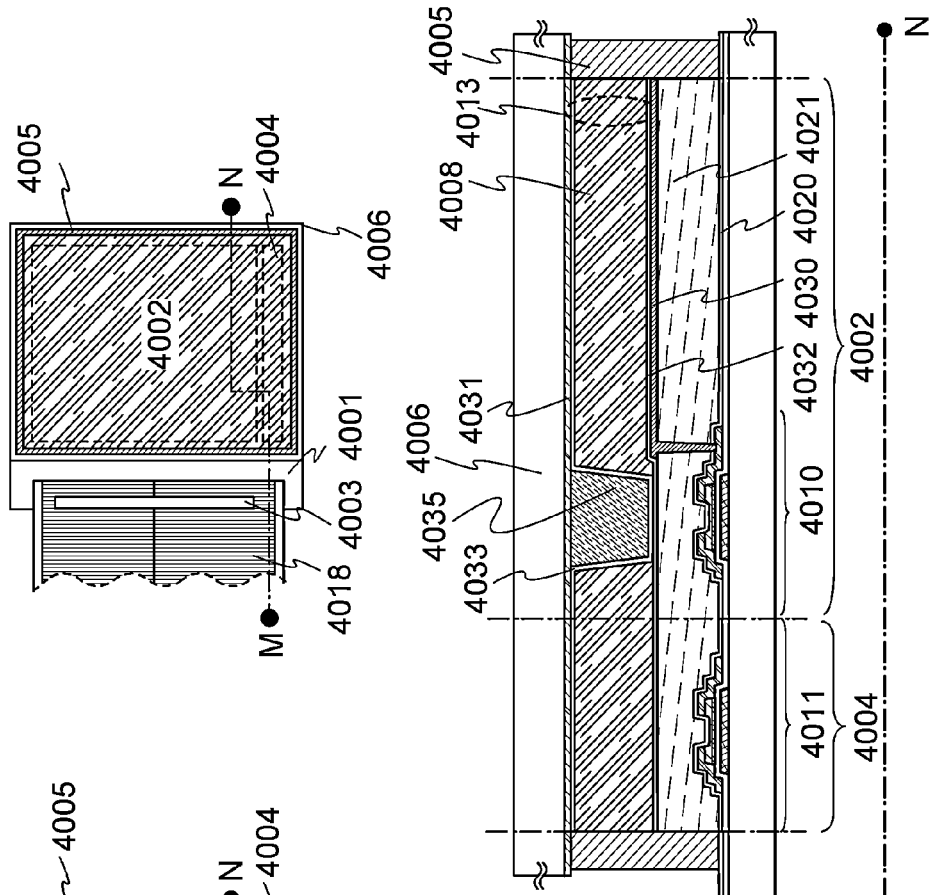
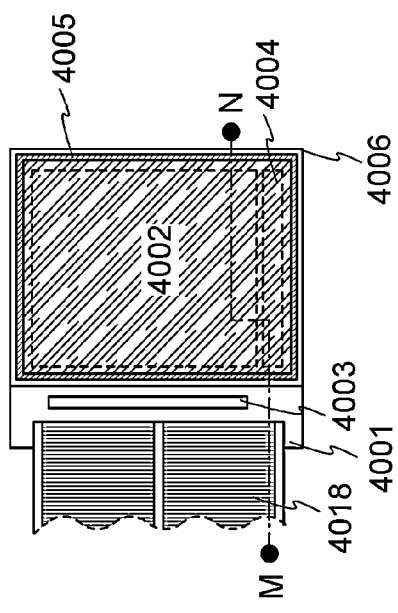
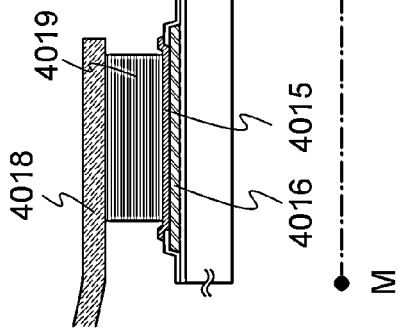
FIG. 22A-1
FIG. 22A-2
FIG. 22B

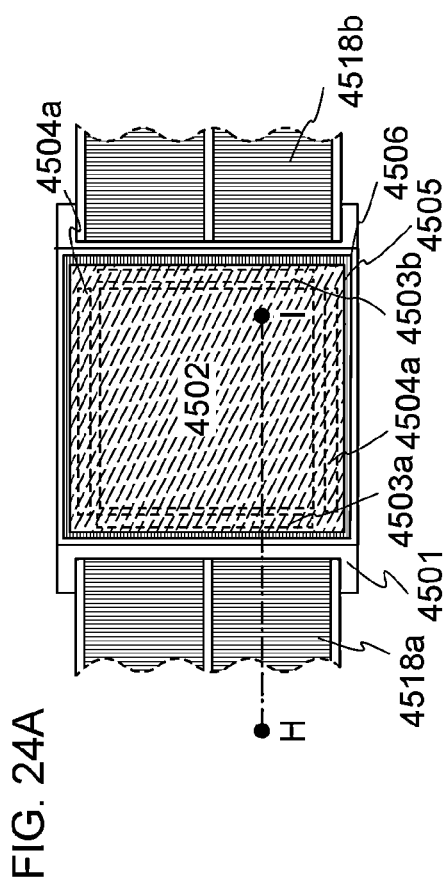
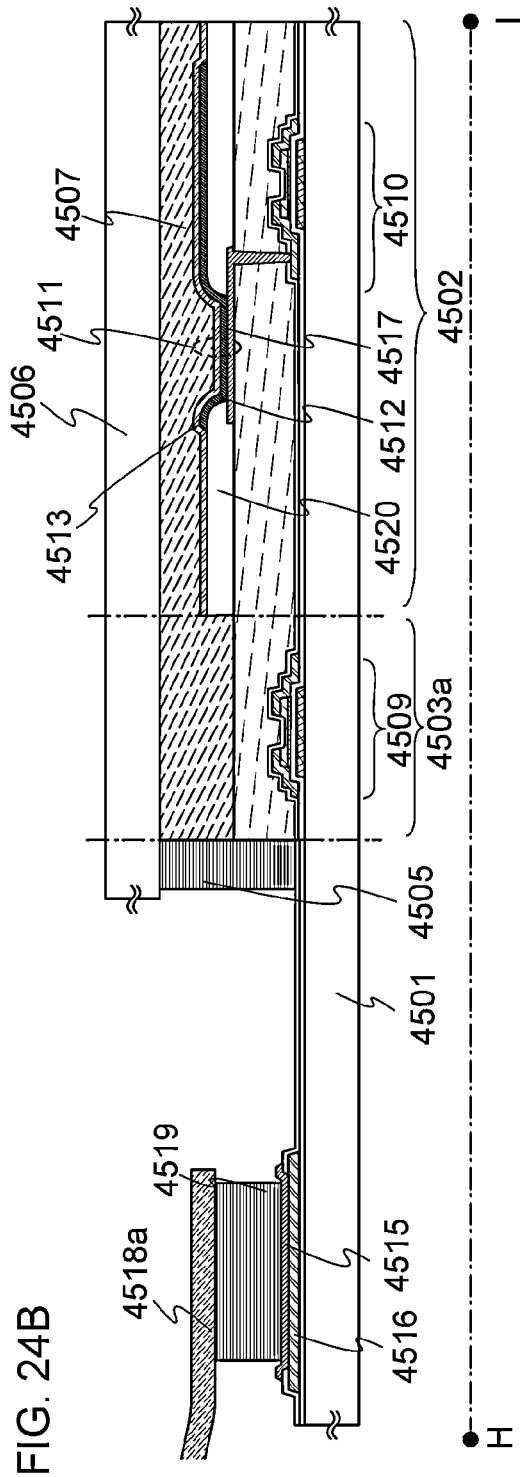
FIG. 24A
FIG. 24B

2631

2632

SEMICONDUCTOR DEVICE AND METHOD FOR MANUFACTURING THE SAME

BACKGROUND OF THE INVENTION

1. Field of the Invention

The present invention relates to a semiconductor device using an oxide semiconductor, a display device using the semiconductor device, and a manufacturing method thereof.

2. Description of the Related Art

In recent years, liquid crystal display devices typified by liquid crystal displays are becoming widespread. As a liquid crystal display, an active matrix liquid crystal display device provided with pixels each including a thin film transistor (TFT) is often used. In a thin film transistor included in an active matrix liquid crystal display device, amorphous silicon or polycrystalline silicon is used as an active layer. Although a thin film transistor using amorphous silicon has low field effect mobility, it can be easily formed over a large-sized substrate such as a large glass substrate. On the other hand, although a thin film transistor using polycrystalline silicon has high field effect mobility, it takes an enormous amount of time to form the thin film transistor using polycrystalline silicon over a large-sized substrate such as a large glass substrate because a crystallization process such as laser annealing is needed.

In view of the foregoing, techniques in which a thin film transistor is manufactured using an oxide semiconductor instead of the above silicon material and applied to electronic devices or optical devices have attracted attention. For example, Patent Document 1 and Patent Document 2 disclose a technique in which a thin film transistor is manufactured using zinc oxide or an In—Ga—Zn—O-based oxide semiconductor for an oxide semiconductor film and such a transistor is used as a switching element or the like of an image display device.

CITATION LIST

Patent Document

[Patent Document 1] Japanese Published Patent Application No. 2007-123861

[Patent Document 2] Japanese Published Patent Application No. 2007-96055

The field effect mobility of a thin film transistor using an oxide semiconductor in a channel formation region is about 10 to 100 times as high as that of a thin film transistor using amorphous silicon. The oxide semiconductor film can be formed by a sputtering method or the like at a temperature of 300° C. or lower. Its manufacturing process is easier than that of a thin film transistor using polycrystalline silicon. Thus, a pixel portion and a peripheral driver circuit of a display device can be formed over the same substrate even in the case where a large-sized substrate is used.

In an active matrix liquid crystal display device, since voltage is applied to a liquid crystal layer and electricity is stored in a storage capacitor in a short gate switching period, a large amount of drive current is necessary. In particular, in a liquid crystal display device with a large screen or a high-definition liquid crystal display device, a larger amount of drive current is necessary. Therefore, a thin film transistor used as a switching element preferably has high field effect mobility.

However, a thin film transistor using an oxide semiconductor has lower field effect mobility than a thin film transistor using polycrystalline silicon, which has been conventionally used for a driver circuit of a liquid crystal display device.

SUMMARY OF THE INVENTION

An object of an embodiment of the present invention is to improve field effect mobility of a thin film transistor using an oxide semiconductor. Another object of an embodiment of the present invention is to suppress increase in off current of a thin film transistor with improved field effect mobility. Another object of an embodiment of the present invention is to provide a display device including a thin film transistor using the oxide semiconductor.

According to an embodiment of the present invention, in forming a thin film transistor, an oxide semiconductor layer is used, and a semiconductor layer having higher electrical conductivity and a smaller thickness than the oxide semiconductor layer is formed between the oxide semiconductor layer and a gate insulating layer.

An embodiment of the present invention is a semiconductor device including: a gate electrode layer; a gate insulating layer over the gate electrode layer; a semiconductor layer over the gate insulating layer; an oxide semiconductor layer over the semiconductor layer; and a source and drain electrode layers over the oxide semiconductor layer, in which the oxide semiconductor layer is an oxide semiconductor layer containing indium, gallium, and zinc; the thickness of the semiconductor layer is smaller than the thickness of the oxide semiconductor layer; the electrical conductivity of the semiconductor layer is higher than the electrical conductivity of the oxide semiconductor layer; and the oxide semiconductor layer and the source and drain electrode layers are electrically connected.

Another embodiment of the present invention is a semiconductor device including: a gate electrode layer; a gate insulating layer over the gate electrode layer; a semiconductor layer over the gate insulating layer; an oxide semiconductor layer over the semiconductor layer; a buffer layer having n-type conductivity over the oxide semiconductor layer; and a source and drain electrode layers over the buffer layer, in which the oxide semiconductor layer and the buffer layer are oxide semiconductor layers each containing indium, gallium, and zinc; the carrier concentration of the buffer layer is higher than the carrier concentration of the oxide semiconductor layer; the thickness of the semiconductor layer is smaller than the thickness of the oxide semiconductor layer; the electrical conductivity of the semiconductor layer is higher than the electrical conductivity of the oxide semiconductor layer; the electrical conductivity of the buffer layer is higher than the electrical conductivity of the semiconductor layer; and the oxide semiconductor layer and the source and drain electrode layers are electrically connected through the buffer layer.

Note that the semiconductor layer is preferably an oxide semiconductor layer containing indium, gallium, and zinc. The electrical conductivity of the semiconductor layer is preferably higher than $1.0 \times 10^{-3}$ S/cm. The oxide semiconductor layer preferably has a region which is between the source and drain electrode layers and whose thickness is smaller than the thickness of a region overlapping with the source and drain electrode layers. The carrier concentration of the barrier layer is preferably $1 \times 10^{18}/cm^3$ or higher and the carrier concentration of the oxide semiconductor layer is preferably lower than $1 \times 10^{17}/cm^3$.

Another embodiment of the present invention is a method for manufacturing a semiconductor device, including the steps of: forming a gate electrode layer over a substrate; forming a gate insulating layer over the gate electrode layer;

forming a first oxide semiconductor film containing indium, gallium, and zinc over the gate insulating layer by a sputtering method; forming a second oxide semiconductor film containing indium, gallium, and zinc over the first oxide semiconductor film by a sputtering method; etching the first oxide semiconductor film and the second oxide semiconductor film to form a semiconductor layer and an island-shaped second oxide semiconductor film; forming a conductive layer over the semiconductor layer and the island-shaped second oxide semiconductor film; and etching the island-shaped second oxide semiconductor film and the conductive layer to form an oxide semiconductor layer and a source and drain electrode layers, in which the proportion of the flow rate of an oxygen gas in a film-forming gas for forming the first oxide semiconductor film is made lower than the proportion of the flow rate of an oxygen gas in a film-forming gas for forming the second oxide semiconductor film.

Note that the proportion of the flow rate of the oxygen gas in the film-forming gas for forming the first oxide semiconductor film is preferably lower than 10 volume %, and the proportion of the flow rate of the oxygen gas in the film-forming gas for forming the second oxide semiconductor film is preferably 10 volume % or higher. Further, the first oxide semiconductor film is preferably formed in an argon gas atmosphere, and the second oxide semiconductor film is preferably formed in an atmosphere of an argon gas and an oxygen gas. Furthermore, a region whose thickness is smaller than the thickness of a region overlapping with the source and the drain electrode layers is preferably provided between the source and drain electrode layers in the oxide semiconductor layer.

As an oxide semiconductor used in this specification, a thin film including a material whose composition formula is represented as $InMO_3(ZnO)_m$ (m>0) is formed, and a thin film transistor including the thin film is manufactured. Note that M denotes one or more of metal elements selected from gallium (Ga), iron (Fe), nickel (Ni), manganese (Mn), and cobalt (Co). In addition to a case where only Ga is contained as M, there is a case where Ga and the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to a metal element contained as M. In this specification, this thin film is also referred to as an "In—Ga—Zn—O-based non-single-crystal film".

An amorphous structure is observed in the In—Ga—Zn—O-based non-single-crystal film by X-ray diffraction (XRD). Note that heat treatment is performed on the In—Ga—Zn—O non-single-crystal film of the examined sample at 200° C. to 500° C., typically 300° C. to 400° C., for 10 minutes to 100 minutes after the film is formed by a sputtering method. In addition, a thin film transistor having electrical characteristics such as an on/off ratio of greater than or equal to $10^9$ and a mobility of greater than or equal to 10 at a gate voltage of ±20 V can be manufactured.

Note that the ordinal numbers such as "first" and "second" in this specification are used for convenience and do not denote the order of steps and the stacking order of layers. In addition, the ordinal numbers in this specification do not denote particular names which specify the invention.

Note that the semiconductor devices in this specification indicate all the devices which can operate by using semiconductor characteristics, and an electronic optical device, a semiconductor circuit, and an electronic device are all included in the semiconductor devices.

According to an embodiment of the present invention, in a thin film transistor using an oxide semiconductor layer, a semiconductor layer having higher electrical conductivity and a smaller thickness than the oxide semiconductor layer is formed between the oxide semiconductor layer and a gate insulating layer, whereby field effect mobility of the thin film transistor can be improved. In addition, increase in off current can be suppressed even in the thin film transistor with improved field effect mobility.

Another embodiment of the present invention can provide a display device with high electrical characteristics and high reliability by using the thin film transistor for a pixel portion and a driver circuit portion of the display device.

BRIEF DESCRIPTION OF THE DRAWINGS

FIGS. 2A to 2C are diagrams illustrating a method for manufacturing a semiconductor device according to an embodiment of the present invention.

FIGS. 3A to 3C are diagrams illustrating a method for manufacturing a semiconductor device according to an embodiment of the present invention.

FIGS. 22A-1 to 22B are diagrams illustrating a semiconductor device according to an embodiment of the present invention.

FIGS. 24A and 24B are diagrams illustrating a semiconductor device according to an embodiment of the present invention.

DETAILED DESCRIPTION OF THE INVENTION

Figure 1A:
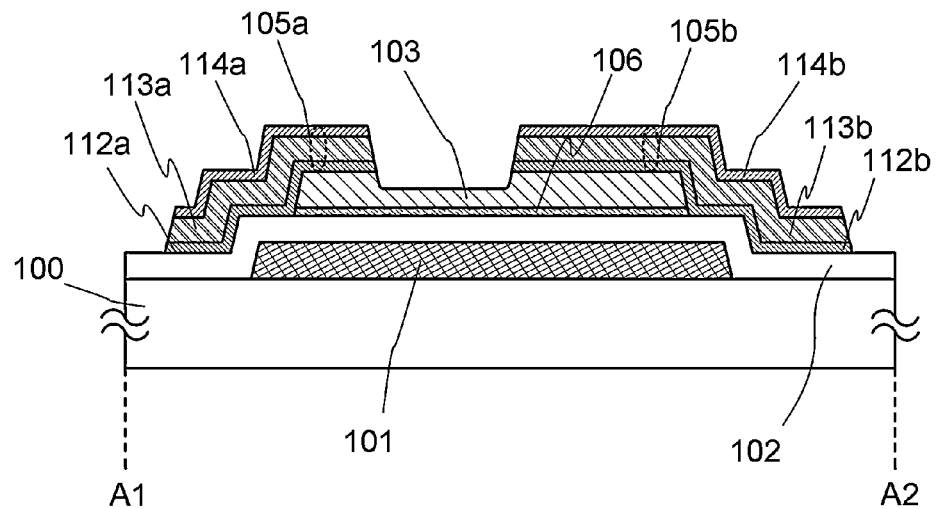
FIGS. 1A and 1B are diagrams illustrating a semiconductor device according to an embodiment of the present invention.

Embodiments and an example of the present invention will be described with reference to the drawings. However, the present invention is not limited to the following description, and it is easily understood by those skilled in the art that the mode and detail can be variously changed without departing from the spirit and scope of the present invention. Therefore, the present invention is not interpreted as being limited to the following description of the embodiments and example. Note that, in all the drawings for explaining the embodiments and example, the same portions or portions having the same functions are denoted by the same reference numerals, and the description thereof will be made only once.

[Embodiment 1]

In this embodiment, a structure of a thin film transistor is described with reference to FIGS. 1A and 1B.

Figure 1B:
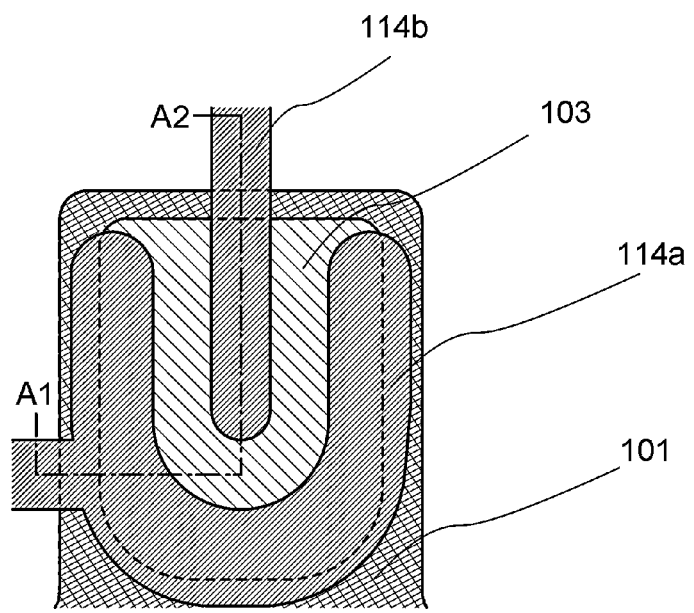
Figure 4:
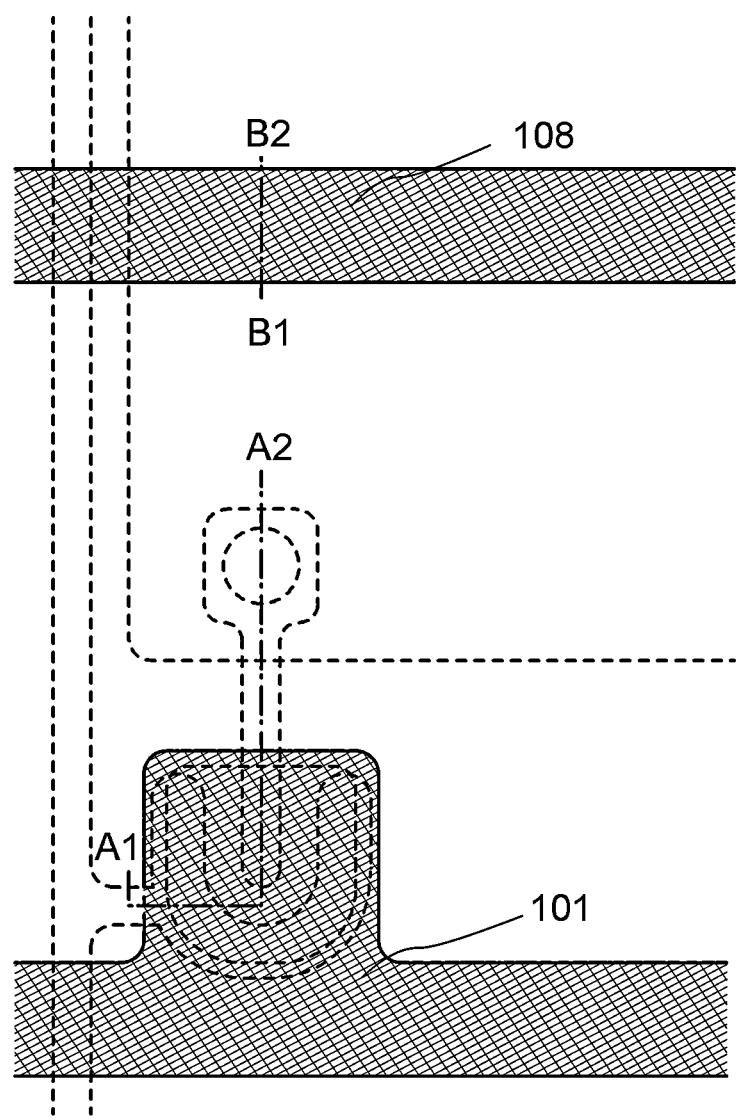
FIG. 4 is a diagram illustrating a method for manufacturing a semiconductor device according to an embodiment of the present invention.
Figure 5:
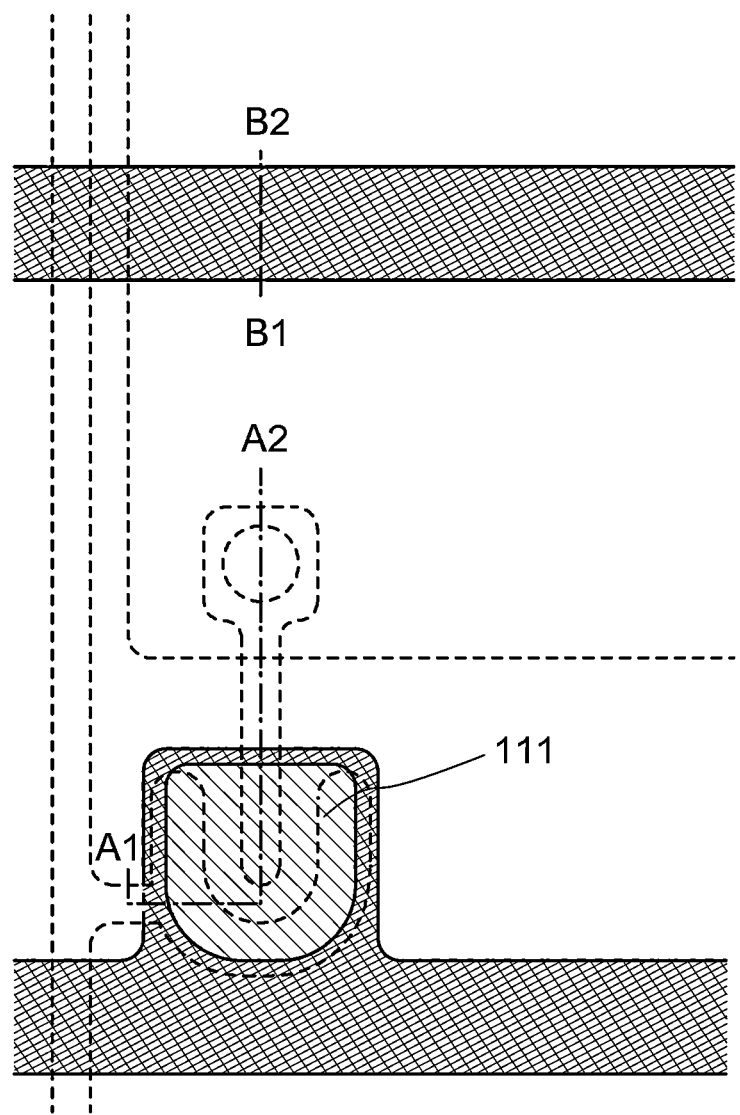
FIG. 5 is a diagram illustrating a method for manufacturing a semiconductor device according to an embodiment of the present invention.
Figure 6:
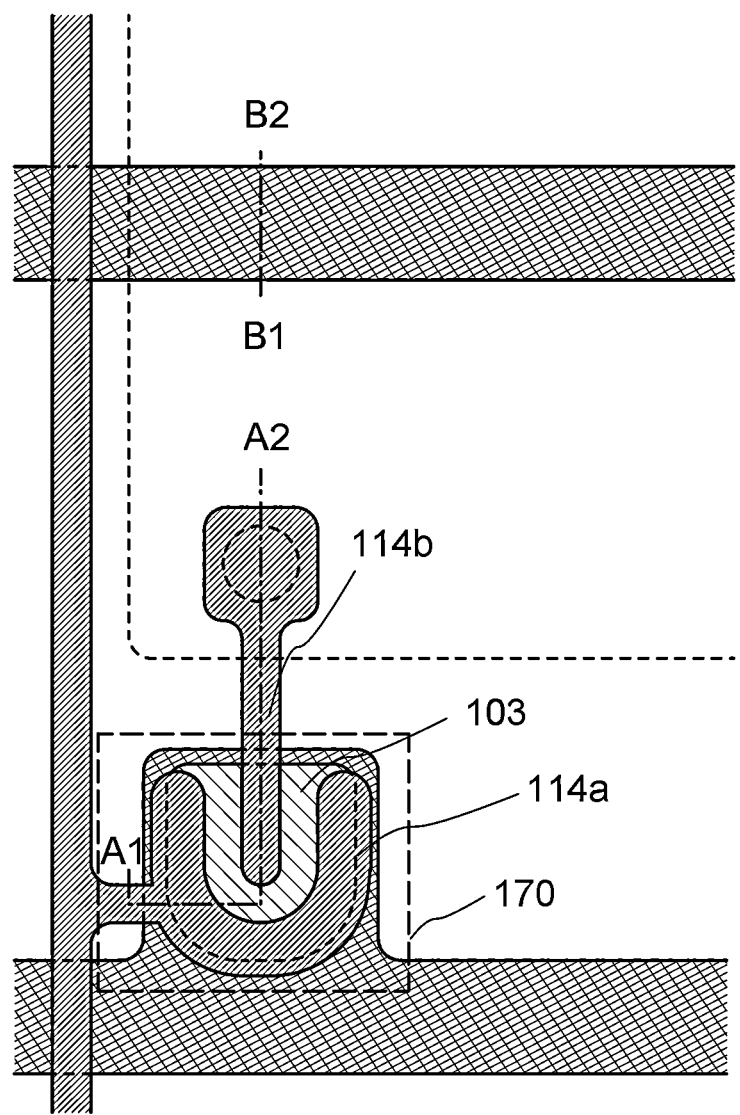
FIG. 6 is a diagram illustrating a method for manufacturing a semiconductor device according to an embodiment of the present invention.

A thin film transistor having a bottom gate structure of this embodiment is illustrated in FIGS. 1A and 1B. FIG. 1A is a cross-sectional view, and FIG. 1B is a plan view. FIG. 1A is a cross-sectional view along line A1-A2 of FIG. 1B.

In the thin film transistor illustrated in FIGS. 1A and 1B, a gate electrode layer 101 is provided over a substrate 100; a gate insulating layer 102 is provided over the gate electrode layer 101; a semiconductor layer 106 is provided over the gate insulating layer 102; an oxide semiconductor layer 103 is provided over the semiconductor layer 106; and a source and drain electrode layers 105a and 105b are provided over the oxide semiconductor layer 103.

The gate electrode layer 101 can be formed to have a single-layer structure or a stacked-layer structure using a metal material such as aluminum, copper, molybdenum, titanium, chromium, tantalum, tungsten, neodymium, or scandium; an alloy material containing any of these materials as its main component; or a nitride containing any of these materials. The gate electrode layer 101 is desirably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, as a stacked-layer structure of the gate electrode layer 101, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used.

The oxide semiconductor layer 103 is formed using an In—Ga—Zn—O-based non-single-crystal film which contains In, Ga, and Zn and includes a material whose composition formula is represented as $InMO_3(ZnO)_m$ (m>0). Note that M denotes one or more of metal elements selected from gallium (Ga), iron (Fe), nickel (Ni), manganese (Mn), and cobalt (Co). In addition to a case where only Ga is contained as M, there is a case where Ga and the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to a metal element contained as M.

The thickness of the oxide semiconductor layer 103 is set to 10 nm to 300 nm, preferably, 20 nm to 100 nm. The oxide semiconductor layer 103 has a region which is between the source and drain electrode layers 105a and 105b and has a smaller thickness than a region overlapping with the source and drain electrode layers 105a and 105b.

The electrical conductivity of the oxide semiconductor layer 103 is preferably $1.0\times10^{-3}$ S/cm or lower. In addition, the electrical conductivity of the oxide semiconductor layer 103 is preferably $1.0\times10^{-11}$ S/cm or higher. The range of the carrier concentration of the oxide semiconductor layer 103 is preferably lower than $1\times10^{17}/cm^3$ (more preferably, $1\times10^{11}/cm^3$ or higher). When the carrier concentration of the oxide semiconductor layer 103 exceeds the above range, the thin film transistor has a risk of being normally-on.

The electrical conductivity of the semiconductor layer 106 is higher than that of the oxide semiconductor layer 103, and the thickness of the semiconductor layer 106 is smaller than that of the oxide semiconductor layer 103. The electrical conductivity of the semiconductor layer 106 is preferably higher than $1.0\times10^{-3}$ S/cm. The thickness of the semiconductor layer 106 is set to greater than or equal to 1 nm and less than or equal to 50 nm, preferably, greater than or equal to 5 nm and less than or equal to 10 nm. Here, since the thickness of the semiconductor layer 106 is smaller than that of the oxide semiconductor layer 103, drain current flows mainly through an etched portion of the oxide semiconductor layer 103 when the thin film transistor is turned off; thus, off current does not flow through the semiconductor layer 106 having high electrical conductivity, whereby increase in off current is suppressed.

In this embodiment, an In—Ga—Zn—O-based non-single-crystal film is used as the semiconductor layer 106. In the case where an In—Ga—Zn—O-based non-single-crystal film is used as the semiconductor layer 106, at least an amorphous component is included in the In—Ga—Zn—O-based non-single-crystal film, and crystal grains (nanocrystals) are included in the amorphous structure of the semiconductor layer 106 in some cases. The crystal grains (nanocrystals) in the semiconductor layer 106 each have a diameter of 1 nm to 10 nm, typically, about 2 nm to 4 nm. However, the semiconductor layer 106 is not limited to the In—Ga—Zn—O-based non-single-crystal film. A semiconductor without including the In—Ga—Zn—O-based non-single-crystal such as an oxide semiconductor, a single crystal semiconductor, a polycrystalline semiconductor, a microcrystalline semiconductor, an amorphous semiconductor, or a compound semiconductor can be used as long as it satisfies the above condition. When the In—Ga—Zn—O-based non-single-crystal film is used as the semiconductor layer 106, the oxide semiconductor layer 103 and the semiconductor layer 106 can be successively formed; therefore, efficiency in manufacturing the thin film transistor and productivity can be improved.

In the case where the In—Ga—Zn—O-based non-single-crystal film is used as the semiconductor layer 106, the proportion of the flow rate of an oxygen gas in the whole film-forming gas for forming the semiconductor layer 106 by sputtering is made lower than that of the flow rate of an oxygen gas in the whole film-forming gas for forming the oxide semiconductor layer 103 by sputtering. Accordingly, the electrical conductivity of the thus-formed semiconductor layer 106 can be made higher than that of the thus-formed oxide semiconductor layer 103. The semiconductor layer 106 is preferably formed under a condition where the proportion of the flow rate of the oxygen gas in the whole film-forming gas is lower than 10 volume %. The oxide semiconductor layer 103 is preferably formed under a condition where the proportion of the flow rate of the oxygen gas in the whole film-forming gas is 10 volume % or higher. In addition, the semiconductor layer 106 may be formed in an atmosphere of rare gas such as an argon gas without containing an oxygen gas.

By employing a stacked-layer structure of the semiconductor layer 106 and the oxide semiconductor layer 103 for an active layer of the thin film transistor, drain current flows mainly through the semiconductor layer 106 having high electrical conductivity when the thin film transistor is turned on, and the field effect mobility can be increased. Further, drain current flows mainly through an etched portion of the oxide semiconductor layer 103 when the thin film transistor is turned off; thus, off current can be prevented from flowing through the semiconductor layer 106 having high electrical conductivity, whereby increase in off current can be suppressed.

The source or drain electrode layer 105*a* has a three-layer structure of a first conductive layer 112*a*, a second conductive layer 113*a*, and a third conductive layer 114*a* while the source or drain electrode layer 105*b* has a three-layer structure of a first conductive layer 112*b*, a second conductive layer 113*b*, and a third conductive layer 114*b*. Each of the first conductive layers 112*a* and 112*b*, the second conductive layers 113*a* and 113*b*, and the third conductive layers 114*a* and 114*b* can be formed using a metal material such as aluminum, copper, molybdenum, titanium, chromium, tantalum, tungsten, neodymium, or scandium; an alloy material containing any of these metal materials as its main component; or a nitride containing any of these metal materials. Each of the first conductive layers 112*a* and 112*b*, the second conductive layers 113*a* and 113*b*, and the third conductive layers 114*a* and 114*b* is desirably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, it is preferable that the first conductive layers 112*a* and 112*b* and the third conductive layers 114*a* and 114*b* be formed using titanium that is a heat-resistant conductive material, and the second conductive layers 113*a* and 113*b* be formed using an aluminum alloy containing neodymium that has low heat resistance. By such a structure, a low resistance property of aluminum is utilized and generation of a hillock can be reduced. Note that, in this embodiment, the source or drain electrode layer 105*a* is formed to have a three-layer structure of the first conductive layer 112*a*, the second conductive layer 113*a*, and the third conductive layer 114*a* while the source or drain electrode layer 105*b* is formed to have a three-layer structure of the first conductive layer 112*b*, the second conductive layer 113*b*, and the third conductive layer 114*b*; however, the source and drain electrode layers 105*a* and 105*b* are not limited to this structure. Thus, the source and drain electrode layers 105*a* and 105 may have a single-layer structure, a two-layer structure, or a stacked structure of four or more layers.

With such a structure, a semiconductor layer having higher electrical conductivity and a smaller thickness than an oxide semiconductor layer is formed between the oxide semiconductor layer serving as an active layer and a gate insulating layer; thus, field effect mobility can be improved when a thin film transistor is turned on. Further, increase in off current can be suppressed even in the thin film transistor with improved field effect mobility.

Note that the structure described in this embodiment can be combined with any of the structures described in another embodiment as appropriate.

[Embodiment 2]

In this embodiment, a manufacturing process of a display device including the thin film transistor described in Embodiment 1 will be described with reference to FIGS. 2A to 2C, FIGS. 3A to 3C, FIG. 4, FIG. 5, FIG. 6, FIG. 7, FIGS. 8A-1 to 8B-2, and FIG. 9. FIGS. 2A to 2C and FIGS. 3A to 3C are cross-sectional views, and FIG. 4, FIG. 5, FIG. 6, and FIG. 7 are plan views. Line A1-A2 and line B1-B2 in each of FIG. 4, FIG. 5, FIG. 6, and FIG. 7 correspond to line A1-A2 and line B1-B2 in each of the cross-sectional views of FIGS. 2A to 2C and FIGS. 3A to 3C, respectively.

First, the substrate 100 is prepared. As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film over its surface, may also be used. The substrate 100 may have a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

In addition, an insulating film as a base film may be formed over the substrate 100. The base film may be formed to have a single-layer structure or a stacked-layer structure of any of a silicon oxide film, a silicon nitride film, a silicon oxynitride film, and a silicon nitride oxide film by a CVD method, a sputtering method, or the like. In the case where a substrate containing mobile ions such as a glass substrate is used as the substrate 100, a film containing nitrogen such as a silicon nitride film or a silicon nitride oxide film is used as the base film, whereby the mobile ions can be prevented from entering the oxide semiconductor layer or the semiconductor layer.

Next, a conductive film for forming a gate wiring including the gate electrode layer 101, a capacitor wiring 108, and a first terminal 121 is formed over the entire area over the substrate 100 by a sputtering method or a vacuum evaporation method. Next, after the conductive film is formed over the entire area over the substrate 100, a first photolithography step is performed. A resist mask is formed, and unnecessary portions are removed by etching to form wirings and an electrode (a gate wiring including the gate electrode layer 101, the capacitor wiring 108, and the first terminal 121). At that time, etching is preferably performed so that at least an end portion of the gate electrode layer 101 is tapered for prevention of disconnection. A cross-sectional view at this stage is illustrated in FIG. 2A. Note that a plan view at this stage corresponds to FIG. 4.

The gate wiring including the gate electrode layer 101, the capacitor wiring 108, and the first terminal 121 in a terminal portion can be formed to have a single-layer structure or a stacked-layer structure using a metal material such as aluminum, copper, molybdenum, titanium, chromium, tantalum, tungsten, neodymium, or scandium; an alloy material containing any of these metal materials as its main component; or a nitride containing any of these metal materials. The gate wiring including the gate electrode layer 101, the capacitor wiring 108, and the first terminal 121 in the terminal portion are desirably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, as a stacked-layer structure of the gate electrode layer 101, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a molybdenum layer and a titanium nitride layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferable.

Next, the gate insulating layer 102 is formed over the entire area over the gate electrode layer 101. The gate insulating layer 102 is formed by a CVD method, a sputtering method, or the like to a thickness of 50 nm to 250 nm.

For example, the gate insulating layer 102 is formed using a silicon oxide film with a thickness of 100 nm by a CVD method or a sputtering method. Needless to say, the gate insulating layer 102 is not limited to such a silicon oxide film. The gate insulating layer 102 may be formed to have a single-layer structure or a stacked-layer structure using another insulating film such as a silicon oxynitride film, a silicon nitride oxide film, a silicon nitride film, an aluminum oxide film, or a tantalum oxide film.

Alternatively, the gate insulating layer 102 can be formed of a silicon oxide layer by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Further alternatively, the gate insulating layer 102 may be formed using one kind of oxide, nitride, oxynitride, or nitride oxide of aluminum, yttrium, or hafnium; or a compound including at least two or more kinds of the aforementioned compounds.

Note that in this specification, oxynitride refers to a substance that contains more oxygen atoms than nitrogen atoms and nitride oxide refers to a substance that contains more nitrogen atoms than oxygen atoms. For example, a "silicon oxynitride film" means a film that contains more oxygen atoms than nitrogen atoms, and oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively, when they are measured by RBS and HFS. Note that percentages of nitrogen, oxygen, silicon, and hydrogen fall within the ranges given above, where the total number of atoms contained in the silicon oxynitride or the silicon nitride oxide is defined as 100 atomic %.

Note that, before oxide semiconductor films for forming the oxide semiconductor layer 103 and the semiconductor layer 106 are formed, reverse sputtering by which plasma is generated by introducing an argon gas is preferably performed, whereby dust attached to a surface of the gate insulating layer 102 is removed. The reverse sputtering refers to a method in which, without application of voltage to a target side, an RF power source is used for application of voltage to a substrate side in an argon atmosphere to modify a surface. Note that instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used. After the reverse sputtering, a first oxide semiconductor film is formed without being exposed to air, whereby dust or moisture can be prevented from attaching to an interface between the gate insulating layer 102 and the semiconductor layer 106.

Next, over the gate insulating layer 102, the first oxide semiconductor film (a first In—Ga—Zn—O-based non-single-crystal film in this embodiment) for forming the semiconductor layer 106 is formed by a sputtering method in an atmosphere of rare gas such as an argon gas and an oxygen gas. Note that the oxygen gas is not necessarily needed. As specific conditions, an oxide semiconductor target containing In, Ga, and Zn ($In_2O_3$:$Ga_2O_3$:$ZnO$=1:1:1) of 8 inches in diameter is used, the distance between the substrate and the target is set to 170 mm, a flow rate ratio of Ar to $O_2$ is 50 to 1 (sccm), and film formation is performed by sputtering at a pressure of 0.4 Pa, with a direct-current (DC) power source of 0.5 kW, and at room temperature. Further, as the target, $Ga_2O_3$ and ZnO in a pellet state may be disposed on a disk of 8 inches in diameter which contains $In_2O_3$.

Despite the intentional use of the target of $In_2O_3$:$Ga_2O_3$:ZnO=1:1:1, an In—Ga—Zn—O-based non-single-crystal film including crystal grains with a size of 1 nm to 10 nm immediately after the film formation may be formed. Note that it can be said that the presence or absence of crystal grains or the density of crystal grains can be adjusted and the diameter size can be adjusted within the range of 1 nm to 10 nm by appropriate adjustment of the composition ratio in the target, the film forming pressure (0.1 Pa to 2.0 Pa), the power (250 W to 3000 W: 8 inches ø), the temperature (room temperature to 100° C.), the reactive sputtering film formation conditions, or the like. The thickness of the first In—Ga—Zn—O-based non-single-crystal film is set to 1 nm to 50 nm, preferably, 5 nm to 10 nm. Needless to say, when the film includes crystal grains, the size of the crystal grains does not exceed the thickness of the film. Further, a pulsed direct current (DC) power source is preferable because dust can be reduced and a thickness distribution is uniform.

By using the In—Ga—Zn—O-based non-single-crystal film as the semiconductor layer 106, the first oxide semiconductor film and a second oxide semiconductor film can be successively formed. Therefore, efficiency in manufacturing the display device and productivity can be improved. Note that although the semiconductor layer 106 is formed using the In—Ga—Zn—O-based non-single-crystal film in this embodiment, the semiconductor layer 106 is not limited thereto; thus, a semiconductor without including the In—Ga—Zn—O-based non-single-crystal such as an oxide semiconductor, a single crystal semiconductor, a polycrystalline semiconductor, a microcrystalline semiconductor, an amorphous semiconductor, or a compound semiconductor can be used as the semiconductor layer 106.

Next, the second oxide semiconductor film (a second In—Ga—Zn—O-based non-single-crystal film in this embodiment) for forming the oxide semiconductor layer 103 is formed by a sputtering method without being exposed to air in an atmosphere of rare gas such as an argon gas and an oxygen gas. As specific conditions, an oxide semiconductor target containing In, Ga, and Zn ($In_2O_3:Ga_2O_3:ZnO=1:1:1$) of 8 inches in diameter is used, the distance between the substrate and the target is set to 170 mm, a flow rate ratio of Ar to $O_2$ is 50 to 5 (sccm), and film formation is performed by sputtering at a pressure of 0.4 Pa, with a direct-current (DC) power source of 0.5 kW, and at room temperature. Further, as the target, $Ga_2O_3$ and ZnO in a pellet state may be disposed on a disk of 8 inches in diameter which contains $In_2O_3$. Note that a pulsed direct current (DC) power source is preferably used because dust can be reduced and a thickness distribution is uniform. The thickness of the second In—Ga—Zn—O-based non-single-crystal film is set to 10 nm to 300 nm, preferably, 20 nm to 100 nm.

The proportion of the flow rate of the oxygen gas in the whole film-forming gas for forming the first In—Ga—Zn—O-based non-single-crystal film by sputtering is made lower than that of the flow rate of the oxygen gas in the whole film-forming gas for forming the second In—Ga—Zn—O-based non-single-crystal film by sputtering. Accordingly, the electrical conductivity of the thus-formed first In—Ga—Zn—O-based non-single-crystal film can be higher than that of the thus-formed second In—Ga—Zn—O-based non-single-crystal film. As a film formation condition for the first In—Ga—Zn—O-based non-single-crystal film, the proportion of the flow rate of the oxygen gas in the whole film-forming gas is preferably lower than 10 volume %. Further, as a film formation condition for the second In—Ga—Zn—O-based non-single-crystal film, the proportion of the flow rate of the oxygen gas in the whole film-forming gas is preferably 10 volume % or higher. Further, the first In—Ga—Zn—O-based non-single-crystal film may be formed in an atmosphere of rare gas such as an argon gas without containing an oxygen gas.

A chamber used for forming the second In—Ga—Zn—O-based non-single-crystal film may be the same or different from the chamber in which the reverse sputtering has been performed.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be formed to be stacked in the same chamber, or a plurality of kinds of materials can be formed by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

In addition, as a film formation method by sputtering, there are also a reactive sputtering method in which a target substance and a sputtering gas component are chemically reacted with each other during film formation to form a thin compound film thereof, and a bias sputtering method in which voltage is also applied to a substrate during film formation.

Next, a second photolithography step is performed. A resist mask is formed, and the first In—Ga—Zn—O-based non-single-crystal film and the second In—Ga—Zn—O-based non-single-crystal film are etched. In etching of the first In—Ga—Zn—O-based non-single-crystal film and the second In—Ga—Zn—O-based non-single-crystal film, organic acid such as citric acid or oxalic acid can be used for etchant. Here, the first In—Ga—Zn—O-based non-single-crystal film and the second In—Ga—Zn—O-based non-single-crystal film are etched by wet etching with use of ITO07N (manufactured by KANTO CHEMICAL CO., INC.) to remove an unnecessary portion. Thus, the first In—Ga—Zn—O-based non-single-crystal film and the second In—Ga—Zn—O-based non-single-crystal film are processed into an island shape, whereby the semiconductor layer 106 formed from the first In—Ga—Zn—O-based non-single-crystal film and an oxide semiconductor film 111 which is the second In—Ga—Zn—O-based non-single-crystal film are formed. The semiconductor layer 106 and the oxide semiconductor film 111 are etched to have a tapered edge, whereby disconnection of a wiring due to a step shape can be prevented. Note that etching here is not limited to wet etching and may be dry etching. A cross-sectional view at this stage is illustrated in FIG. 2B. Note that a plan view at this stage corresponds to FIG. 5.

Next, a third photolithography step is performed. A resist mask is formed, and unnecessary portions are removed by etching to form a contact hole reaching the wiring or the electrode layer which is formed from the same material as the gate electrode layer 101. This contact hole is provided for direct contact with the conductive film formed later. For example, a contact hole is formed when a thin film transistor whose gate electrode layer is in direct contact with the source or drain electrode layer in the driver circuit is formed, or when a terminal that is electrically connected to a gate wiring of a terminal portion is formed.

Next, a first conductive layer 112, a second conductive layer 113, and a third conductive layer 114 are formed over the semiconductor layer 106 and the oxide semiconductor film 111 by a sputtering method or a vacuum evaporation method with use of a metal material. A cross-sectional view at this stage is illustrated in FIG. 2C.

Each of the first conductive layer 112, the second conductive layer 113, and the third conductive layer 114 can be formed using a metal material such as aluminum, copper, molybdenum, titanium, chromium, tantalum, tungsten, neodymium, or scandium; an alloy material containing any of these metal materials as its main component; or a nitride containing any of these metal materials. The first conductive layer 112, the second conductive layer 113, and the third conductive layer 114 are each desirably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

Here, the first conductive layer 112 and the third conductive layer 114 are formed using titanium that is a heat-resistant conductive material, and the second conductive layer 113 is formed using an aluminum alloy containing neodymium. By such a structure, a low resistance property of aluminum is utilized and generation of a hillock can be reduced. Note that, in this embodiment, a three-layer structure of the first conductive layer 112, the second conductive layer 113, and the third conductive layer 114 is employed; however, an embodiment of the present invention is not limited thereto. Thus, a single-layer structure, a two-layer structure, or a stacked structure of four or more layers may be employed. For example, a single-layer structure of a titanium film or a single-layer structure of an aluminum film containing silicon may be employed.

Next, a fourth photolithography step is performed. A resist mask 131 is formed, and an unnecessary portion is removed by etching, whereby the source and drain electrode layers 105a and 105b, the oxide semiconductor layer 103, and a connection electrode 120 are formed. Wet etching or dry etching is used as an etching method at this time. For example, in the case where the first conductive layer 112 and the third conductive layer 114 are formed using titanium and the second conductive layer 113 is formed using an aluminum alloy containing neodymium, wet etching can be performed by using a hydrogen peroxide solution or heated hydrochloric acid as etchant. In this etching step, a region to be exposed in the oxide semiconductor film 111 is also partly etched; thus, the oxide semiconductor layer 103 has a region which is between the source and drain electrode layers 105a and 105b and whose thickness is smaller than the thickness of a region overlapping with the source and drain electrode layer 105a and 105b. Accordingly, a channel formation region of the thin film transistor overlaps with the small-thickness region of the oxide semiconductor layer 103.

In FIG. 3A, the first conductive layer 112, the second conductive layer 113, the third conductive layer 114, and the oxide semiconductor film 111 can be etched at a time by etching in which a hydrogen peroxide solution or heated hydrochloric acid is used as etchant; therefore, end portions of the source and drain electrode layers 105a and 105b are aligned with end portions of the oxide semiconductor layer 103, and a continuous structure can be formed. In addition, wet etching allows the layers to be etched isotropically, so that the end portions of the source and drain electrode layers 105a and 105b are recessed from the resist mask 131. Through the above steps, a thin film transistor 170 in which the oxide semiconductor layer 103 and the semiconductor layer 106 serve as a channel formation region can be manufactured. A cross-sectional view at this stage is illustrated in FIG. 3A. Note that a plan view at this stage corresponds to FIG. 6.

Here, heat treatment at 200° C. to 600° C., typically 250° C. to 500° C., is preferably performed. Here, heat treatment is performed in a nitrogen atmosphere in a furnace at 350° C. for one hour. Through this heat treatment, rearrangement at the atomic level occurs in the In—Ga—Zn—O-based non-single-crystal film. Because strain energy which inhibits carrier movement is released by the heat treatment, the heat treatment (including optical annealing) is important. Note that there is no particular limitation on the timing of heat treatment as long as it is performed after formation of the second In—Ga—Zn—O-based non-single-crystal film, and for example, heat treatment may be performed after formation of a pixel electrode.

Further, the exposed channel formation region of the oxide semiconductor layer 103 may be subjected to oxygen radical treatment. By performing the oxygen radical treatment, the thin film transistor can be normally-off. In addition, the radical treatment can repair damage due to the etching of the oxide semiconductor layer 103. The radical treatment is preferably performed in an atmosphere of $O_2$ or $N_2O$, and preferably an atmosphere of $N_2$, He, or Ar each containing oxygen. Alternatively, the radical treatment may be performed in an atmosphere in which $Cl_2$ and $CF_4$ are added to the above atmosphere. Note that the radical treatment is preferably performed with no bias applied.

In the fourth photolithography step, a second terminal 122 made from the same material as the source and drain electrode layers 105a and 105b is also left in the terminal portion. Note that the second terminal 122 is electrically connected to a source wiring (a source wiring including the source and drain electrode layers 105a and 105b).

In the terminal portion, the connection electrode 120 is directly connected to the first terminal 121 through the contact hole formed in the gate insulating layer 102. Note that although not illustrated here, a source or drain wiring of the thin film transistor of the driver circuit is directly connected to the gate electrode through the same steps as the above-described steps.

Further, by use of a resist mask having regions with plural thicknesses (typically, two different thicknesses) which is formed using a multi-tone mask, the number of resist masks can be reduced, resulting in simplified process and lower costs.

Next, the resist mask 131 is removed, and a protective insulating layer 107 is formed to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Next, a fifth photolithography step is performed. A resist mask is formed, and the protective insulating layer 107 is etched to form a contact hole 125 reaching the drain electrode layer 105b. In addition, by the etching here, a contact hole 127 which reaches the second terminal 122 and a contact hole 126 which reaches the connection electrode 120 are formed. A cross-sectional view at this stage is illustrated in FIG. 3B.

Then, after the resist mask is removed, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—ZnO) may be used in order to improve etching processability.

Next, a sixth photolithography step is performed. A resist mask is formed, and an unnecessary portion is removed by etching to form a pixel electrode layer 110.

In the sixth photolithography step, a storage capacitor is formed with the capacitor wiring 108 and the pixel electrode layer 110, in which the gate insulating layer 102 and the protective insulating layer 107 in the capacitor portion are used as a dielectric.

In addition, in the sixth photolithography step, the first terminal and the second terminal are covered with the resist mask, and transparent conductive films 128 and 129 are left in the terminal portion. The transparent conductive films 128 and 129 serve as electrodes or wirings that are used for connection with an FPC. The transparent conductive film 128 formed over the connection electrode 120 that is directly connected to the first terminal 121 serves as a connection terminal electrode which functions as an input terminal for the gate wiring. The transparent conductive film 129 formed over the second terminal 122 serves as a connection terminal electrode which functions as an input terminal for the source wiring.

Then, the resist mask is removed. A cross-sectional view at this stage is illustrated in FIG. 3C. Note that a plan view at this stage corresponds to FIG. 7.

Figures 1, 8A:
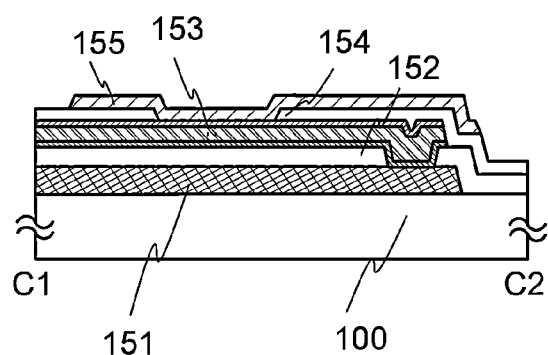
FIGS. 8A-1 to 8B-2 are diagrams illustrating a semiconductor device according to an embodiment of the present invention.
Figures 2, 8A:
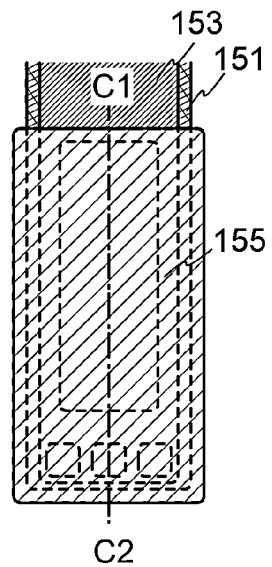
Figures 1, 8B:
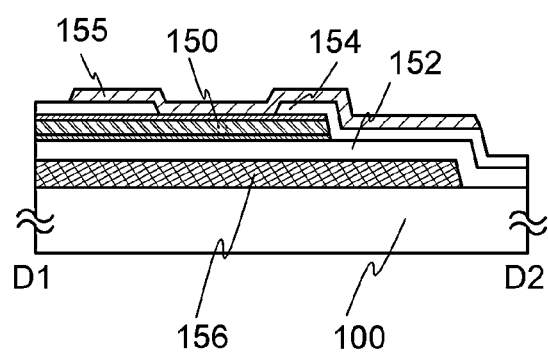
Figures 2, 8B:
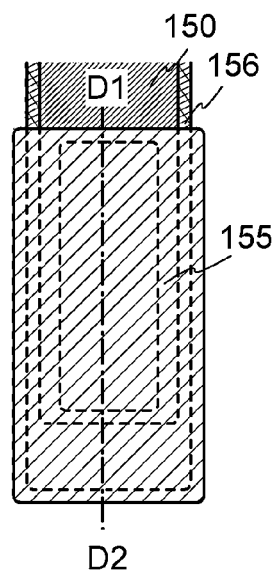

Further, FIGS. 8A-1 and 8B-1 are a cross-sectional view of a gate wiring terminal portion at this stage and a top view thereof, respectively. FIG. 8A-1 is a cross-sectional view taken along line C1-C2 of FIG. 8B-1. In FIG. 8A-1, a transparent conductive film 155 formed over a protective insulating film 154 is a connection terminal electrode serving as an input terminal. Furthermore, in FIG. 8A-1, in the terminal portion, the first terminal 151 formed from the same material as the gate wiring and a connection electrode 153 formed from the same material as the source wiring are overlapped with each other with a gate insulating layer 152 interposed therebetween and are electrically connected. In addition, the connection electrode 153 and the transparent conductive film 155 are in direct contact with each other through a contact hole provided in the protective insulating film 154 to form conduction therebetween.

Further, FIGS. 8B-1 and 8B-2 are a cross-sectional view of a source wiring terminal portion and a top view thereof, respectively. FIG. 8B-1 is a cross-sectional view taken along line D1-D2 of FIG. 8B-2. In FIG. 8B-1, the transparent conductive film 155 formed over the protective insulating film 154 is a connection terminal electrode serving as an input terminal. Furthermore, in FIG. 8B-1, in the terminal portion, an electrode 156 formed from the same material as the gate wiring is located below and overlapped with the second terminal 150, which is electrically connected to the source wiring, with the gate insulating layer 102 interposed therebetween. The electrode 156 is not electrically connected to the second terminal 150. When the electrode 156 is set to, for example, floating, GND, or 0 V such that the potential of the electrode 156 is different from the potential of the second terminal 150, a capacitor for preventing noise or static electricity can be formed. In addition, the second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

By these six photolithography steps, using six photomasks, a pixel thin film transistor portion including the thin film transistor 170 that is a bottom-gate n-channel thin film transistor, and a storage capacitor can be completed. These are arranged in matrix in respective pixels so that a pixel portion is formed, which can be used as one of substrates for manufacturing an active matrix display. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 7:
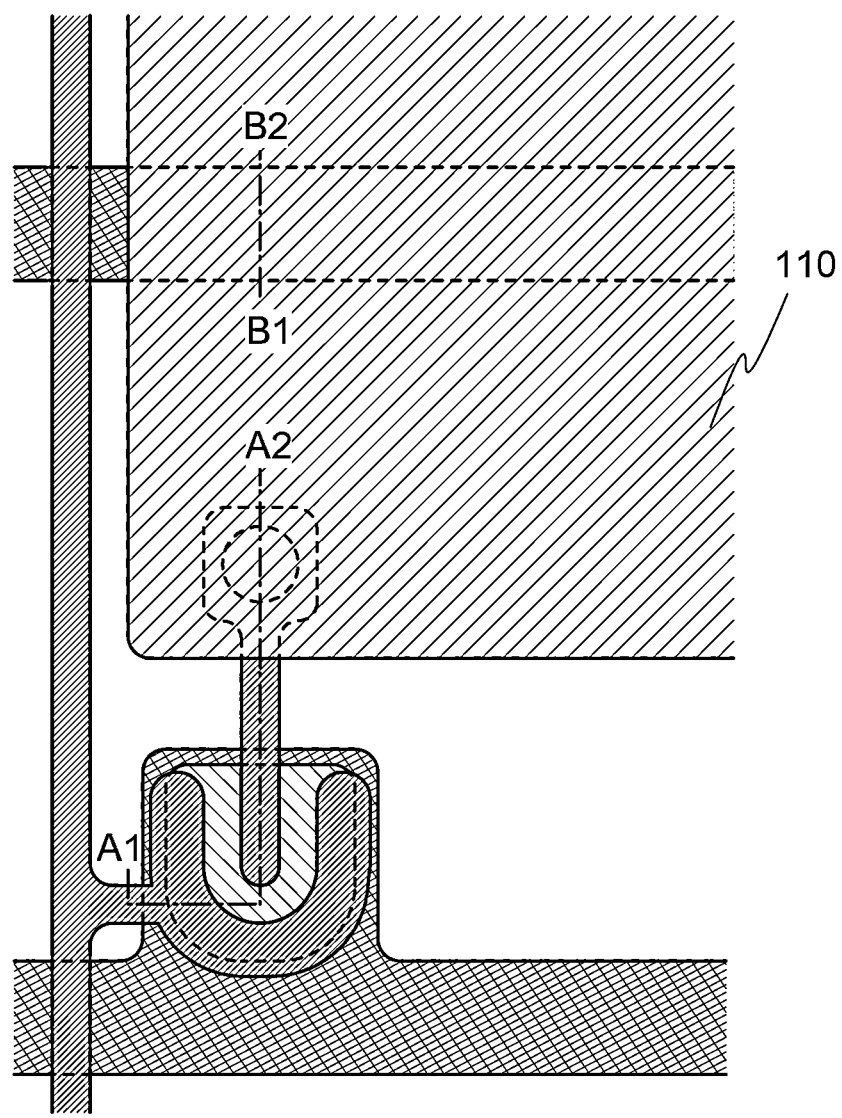
FIG. 7 is a diagram illustrating a method for manufacturing a semiconductor device according to an embodiment of the present invention.
Figure 9:
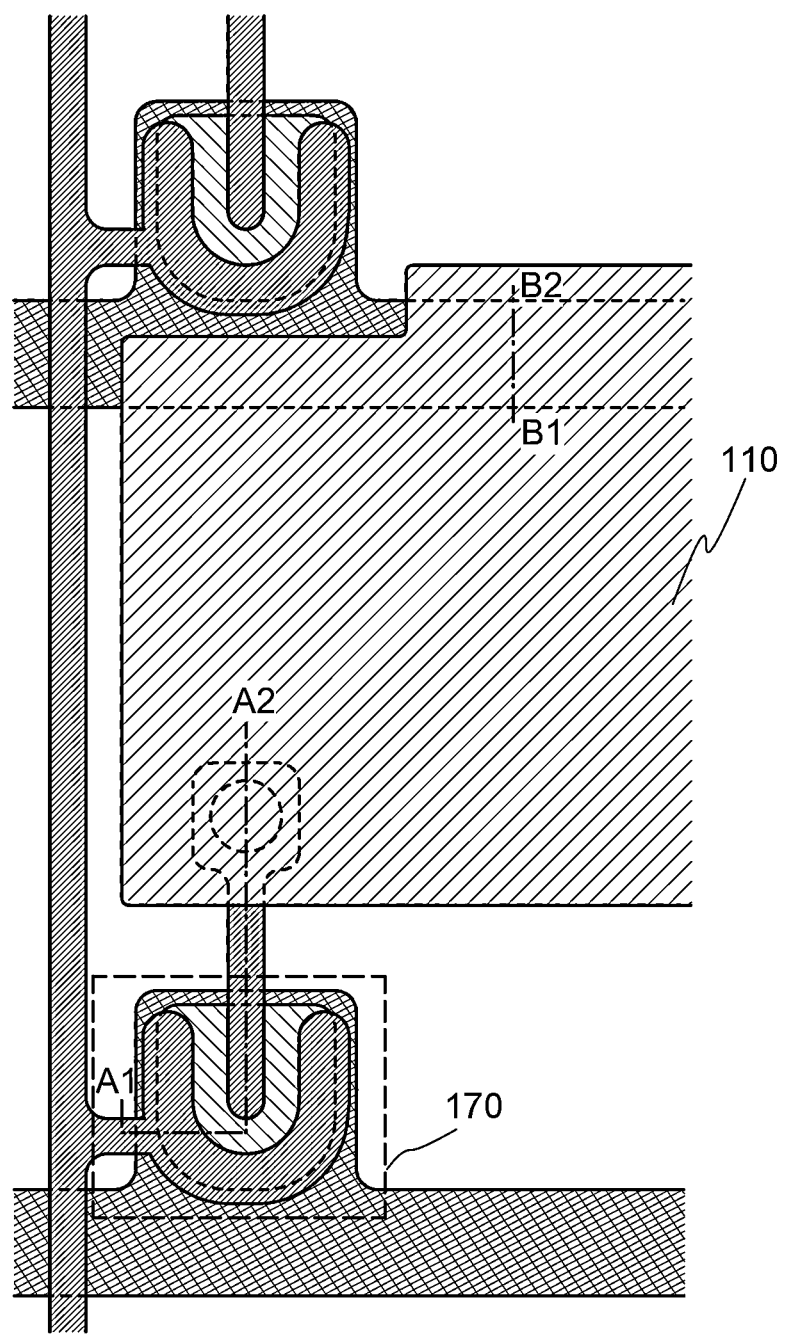
FIG. 9 is a diagram illustrating a semiconductor device according to an embodiment of the present invention.

Further, this embodiment is not limited to a pixel structure in FIG. 7, and an example of a plan view different from FIG. 7 is illustrated in FIG. 9. FIG. 9 illustrates an example in which a capacitor wiring is not provided and a storage capacitor is formed with a pixel electrode and a gate wiring of an adjacent pixel which overlap each other with a protective insulating film and a gate insulating layer interposed therebetween. In this case, the capacitor wiring and the third terminal connected to the capacitor wiring can be omitted. Note that in FIG. 9, the same portions as those in FIG. 7 are denoted by the same reference numerals.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique which is so-called black insertion by which an entirely black image is displayed every other frame.

Further, there is another driving technique which is so-called double-frame rate driving. In the double-frame rate driving, a normal vertical synchronizing frequency is set 1.5 times or more or 2 times or more, whereby moving image characteristics are improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lightning in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

The n-channel transistor obtained in this embodiment includes an In—Ga—Zn—O-based non-single-crystal film as a channel formation region and has excellent dynamic characteristics; thus, it can be combined with these driving techniques.

In the case of manufacturing a light-emitting display device, one electrode (also called a cathode) of an organic light-emitting element is set at a low power supply potential such as GND or 0 V; thus, a fourth terminal for setting the cathode at a low power supply potential such as GND or 0 V is provided in a terminal portion. In addition, in the case of manufacturing a light-emitting display device, besides a source wiring and a gate wiring, a power supply line is provided. Accordingly, a fifth terminal which is electrically connected to the power supply line is provided in a terminal portion.

As described above, in a thin film transistor using an oxide semiconductor layer, a semiconductor layer having higher electrical conductivity and a smaller thickness than the oxide semiconductor layer is formed between the oxide semiconductor layer and a gate insulating layer, whereby field effect mobility of the thin film transistor can be improved. In addition, increase in off current can be suppressed even in the thin film transistor with improved field effect mobility.

By using the thin film transistor for a pixel portion and a driver circuit portion of a display device, the display device with high electrical characteristics and high reliability can be provided.

Note that the structure described in this embodiment can be combined with any of the structures described in another embodiment as appropriate.

[Embodiment 3]

In this embodiment, a thin film transistor having a different structure than that of the thin film transistor described in Embodiment 1 is described with reference to FIG. 10.

Figure 10:
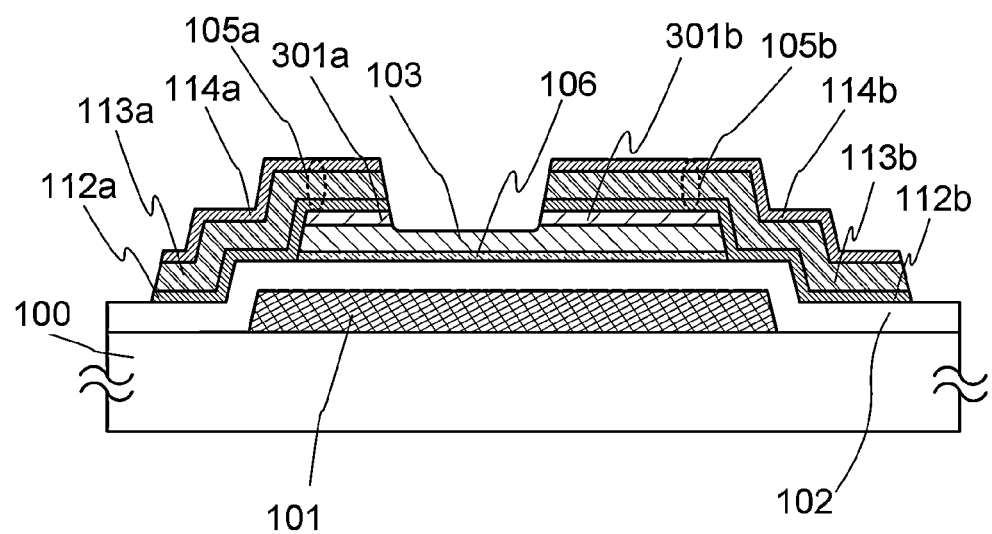
FIG. 10 is a diagram illustrating a semiconductor device according to an embodiment of the present invention.

A thin film transistor having a bottom gate structure of this embodiment is illustrated in FIG. 10. In the thin film transistor illustrated in FIG. 10, the gate electrode layer 101 is provided over the substrate 100; the gate insulating layer 102 is provided over the gate electrode layer 101; the semiconductor layer 106 is provided over the gate insulating layer 102; the oxide semiconductor layer 103 is provided over the semiconductor layer 106; buffer layers 301a and 301b are provided over the oxide semiconductor layer 103; and the source and drain electrode layers 105a and 105b are provided over the buffer layers 301a and 301b. The source or drain electrode layer 105a has a three-layer structure of the first conductive layer 112a, the second conductive layer 113a, and the third conductive layer 114a while the source or drain electrode layer 105b has a three-layer structure of the first conductive layer 112b, the second conductive layer 113b, and the third conductive layer 114b. That is, the thin film transistor illustrated in FIG. 10 has a structure in which the buffer layers 301a and 301b are provided between the oxide semiconductor layer 103 and the source and drain electrode layers 105a and 105b in the thin film transistor illustrated in FIGS. 1A and 1B in Embodiment 1.

In a manner similar to formation of the oxide semiconductor layer 103, the buffer layers 301a and 301b serving as a source and drain regions are formed using an In—Ga—Zn—O-based non-single-crystal film which is an oxide semiconductor film containing In, Ga, and Zn. Note that the buffer layers 301a and 301b have n-type conductivity and higher electrical conductivity than the oxide semiconductor layer 103. The electrical conductivity of the buffer layers 301a and 301b is approximately equal to or higher than that of the semiconductor layer 106. Further, the buffer layers 301a and 301b are In—Ga—Zn—O-based non-single-crystal films, and include at least an amorphous component. In addition, the buffer layers 301a and 301b include crystal grains (nanocrsytals) in the amorphous structure in some cases. The crystal grains (nanocrystals) each have a diameter of 1 nm to 10 nm, typically, about 2 nm to 4 nm.

The In—Ga—Zn—O-based non-single-crystal film used for the buffer layers 301a and 301b is formed by a sputtering method. As specific conditions, an oxide semiconductor target containing In, Ga, and Zn ($In_2O_3:Ga_2O_3:ZnO=1:1:1$) of 8 inches in diameter is used, the distance between the substrate and the target is set to 170 mm, a flow rate ratio of Ar to $O_2$ is 50 to 1 (sccm), and film formation is performed by sputtering at a pressure of 0.4 Pa, with a direct-current (DC) power source of 0.5 kW, and at room temperature.

Note that the conditions of forming the In—Ga—Zn—O-based non-single-crystal film used for the buffer layers 301a and 301b are different from those of forming the In—Ga—Zn—O-based non-single-crystal film used for the oxide semiconductor layer or the semiconductor layer. For example, the proportion of the flow rate of the oxygen gas in the film-forming gas for forming the In—Ga—Zn—O-based non-single-crystal film used for the buffer layers 301a and 301b is made lower than that of the flow rate of the oxygen gas to the film-forming gas for forming the In—Ga—Zn—O-based non-single-crystal film used for the oxide semiconductor layer. In addition, the proportion of the flow rate of the oxygen gas in the film-forming gas for forming the In—Ga—Zn—O-based non-single-crystal film used for the buffer layers 301a and 301b is made approximately equal to or lower than that of the flow rate of the oxygen gas to the film-forming gas for forming the In—Ga—Zn—O-based non-single-crystal film used for the semiconductor layer. Further, the In—Ga—Zn—O-based non-single-crystal film used for the buffer layers 301a and 301b may be formed in an atmosphere of rare gas such as an argon gas without containing an oxygen gas.

The thickness of the In—Ga—Zn—O-based non-single-crystal film used for the buffer layers 301a and 301b is set to 5 nm to 20 nm. Needless to say, when the film includes crystal grains, the size of the crystal grains does not exceed the thickness of the film. In this embodiment, the thickness of the In—Ga—Zn—O-based non-single-crystal film used for the buffer layers 301a and 301b is set to 5 nm.

The buffer layers 301a and 301b may contain an impurity element imparting n-type conductivity. As an example of the impurity element, it is possible to use, for example, magnesium, aluminum, titanium, iron, tin, calcium, germanium, scandium, yttrium, zirconium, hafnium, boron, thallium, or lead. In the case where magnesium, aluminum, titanium, or the like is contained in the buffer layers, there is an effect of blocking oxygen, and the like, so that the oxygen concentration of the oxide semiconductor layer can be maintained within an optimal range by heat treatment or the like after film formation.

The carrier concentration of the buffer layers is preferably $1\times10^{18}/cm^3$ or higher (and $1\times10^{22}/cm^3$ or lower).

As described above, provision of the buffer layers 301a and 301b can make thermal stability improved more than formation of Schottky junction do, between the oxide semiconductor layer and the semiconductor layer and the source and drain electrode layers, whereby operating characteristics of the thin film transistor can be stabilized. In addition, because of high electrical conductivity, favorable mobility can be ensured even when high drain voltage is applied.

Note that, as for a structure and materials of the thin film transistor of this embodiment other than the buffer layers 301a and 301b, Embodiment 1 is to be referred to.

Figure 11:
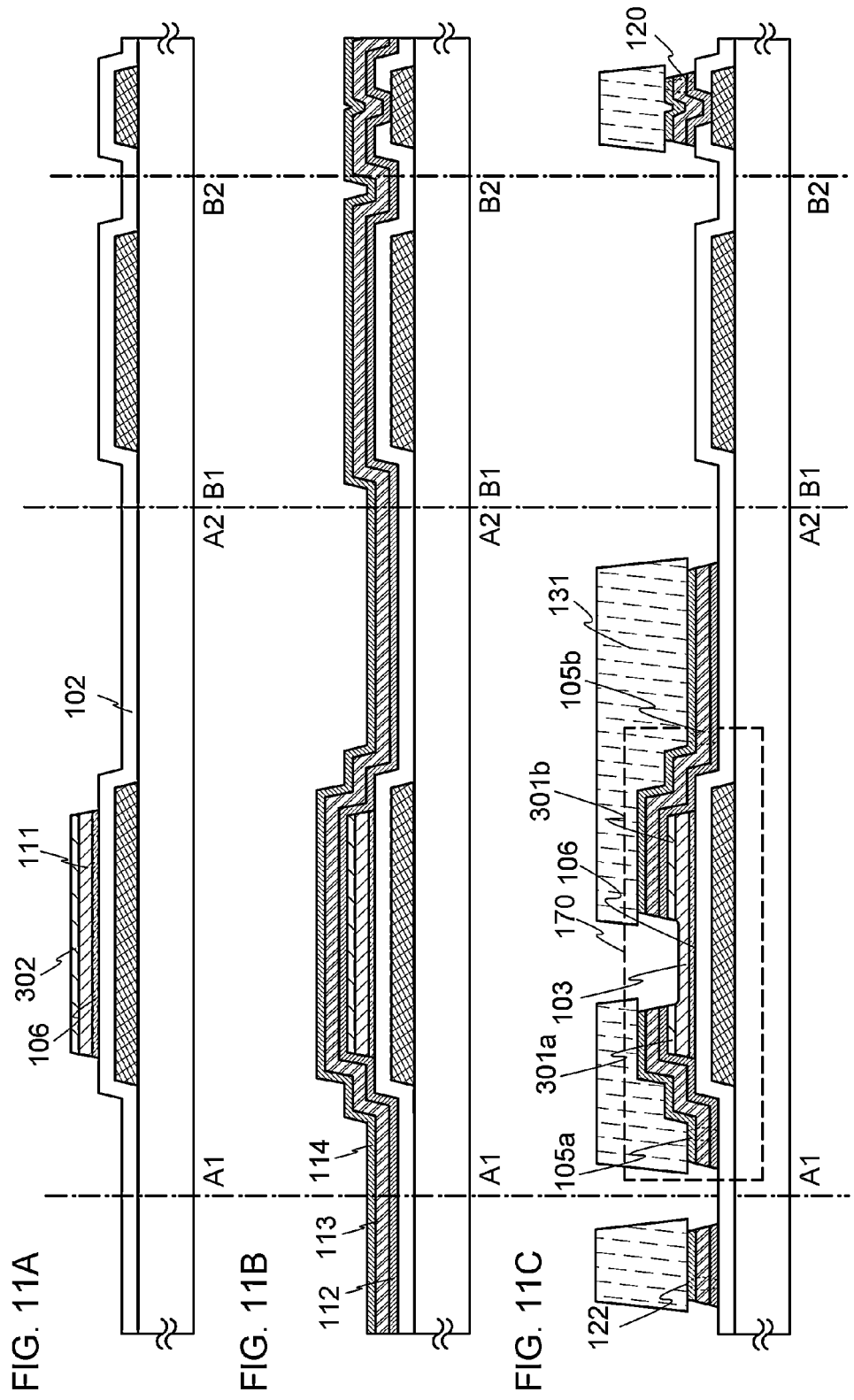
FIGS. 11A to 11C are diagrams illustrating a method for manufacturing a semiconductor device according to an embodiment of the present invention.

A manufacturing process of the thin film transistor of this embodiment is almost similar to the manufacturing process of the thin film transistor described in Embodiment 2. First, by the method described in Embodiment 2, steps up to forming the second oxide semiconductor film for forming the oxide semiconductor layer 103 are performed. Following the above steps, the oxide semiconductor film for forming the buffer layers 301a and 301b is formed by sputtering with use of the above method. Next, by a second photolithography step, in a manner similar to formation of the semiconductor layer 106 and the oxide semiconductor film 111, the oxide semiconductor film for forming the buffer layers 301a and 301b is etched into an island shape, whereby an oxide semiconductor film 302 is formed (see FIG. 11A). Then, by the method described in Embodiment 2, steps up to forming the first conductive layer 112, the second conductive layer 113, and the third conductive layer 114 are performed (see FIG. 11B). Next, by a fourth photolithography step, in a manner similar to formation of the source and drain electrode layers 105a and 105b and the oxide semiconductor layer 103, the oxide semiconductor film 302 is etched to form the buffer layers 301a and 301b (see FIG. 11C). Subsequent steps are similar to those in Embodiment 2.

Note that the structure described in this embodiment can be combined with any of the structures described in another embodiment as appropriate.

[Embodiment 4]

In this embodiment, an example will be described below, in which at least part of a driver circuit and a thin film transistor arranged in a pixel portion are formed over the same substrate in a display device which is one example of a semiconductor device.

The thin film transistor to be arranged in the pixel portion is formed according to Embodiment 2. Further, the thin film transistor described in Embodiment 2 is an n-channel TFT, and thus part of a driver circuit that can include an n-channel TFT among driver circuits is formed over the same substrate as the thin film transistor of the pixel portion.

Figure 14A:
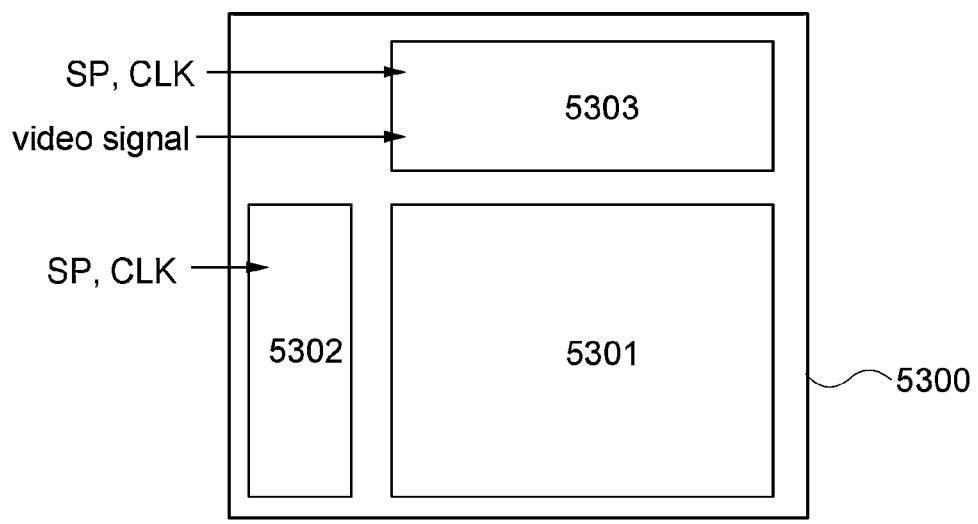
FIGS. 14A and 14B are block diagrams each illustrating a semiconductor device.

FIG. 14A illustrates an example of a block diagram of an active matrix liquid crystal display device which is an example of a semiconductor device. The display device illustrated in FIG. 14A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in each of Embodiments 1 to 3 is an n-channel TFT, and a signal line driver circuit including the n-channel TFT is described with reference to FIG. 15.

Figure 15:
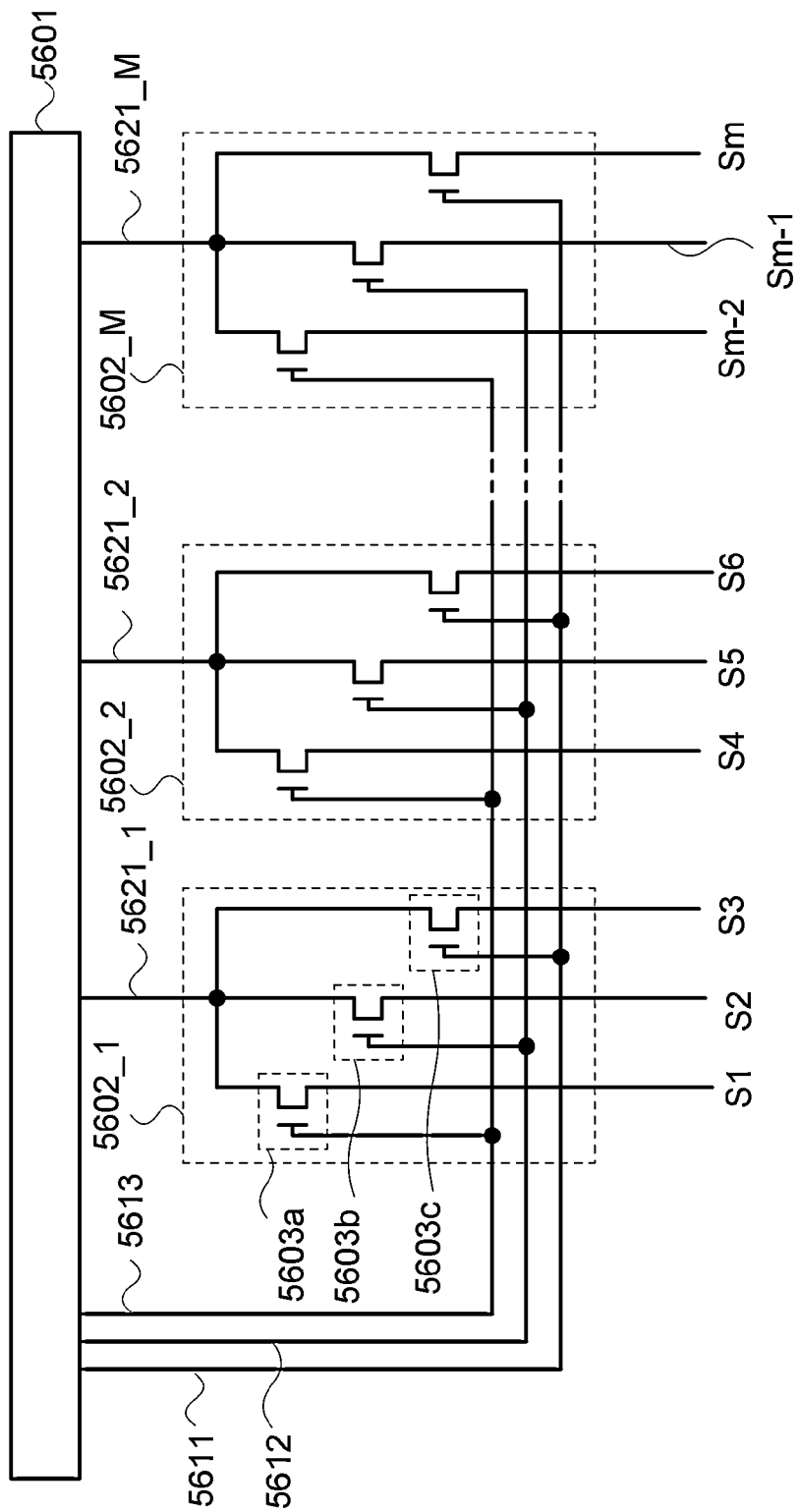
FIG. 15 is a diagram illustrating a configuration of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines (a signal line Sm−2, a signal line Sm−1, and a signal line Sm (m=3M)) via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−2, a signal line Sj−1, and a signal line Sj (j=3J) via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed using a single crystal semiconductor. The switch groups 5602_1 to 5602_M are preferably formed over the same substrate as the pixel portion is. Therefore, the driver IC 5601 and the switch groups 5602_1 to 5602_M are preferably connected through an FPC or the like. Alternatively, the driver IC 5601 may be formed by providing a single crystal semiconductor layer over the same substrate as the pixel portion is by a method such as bonding.

Figure 16:
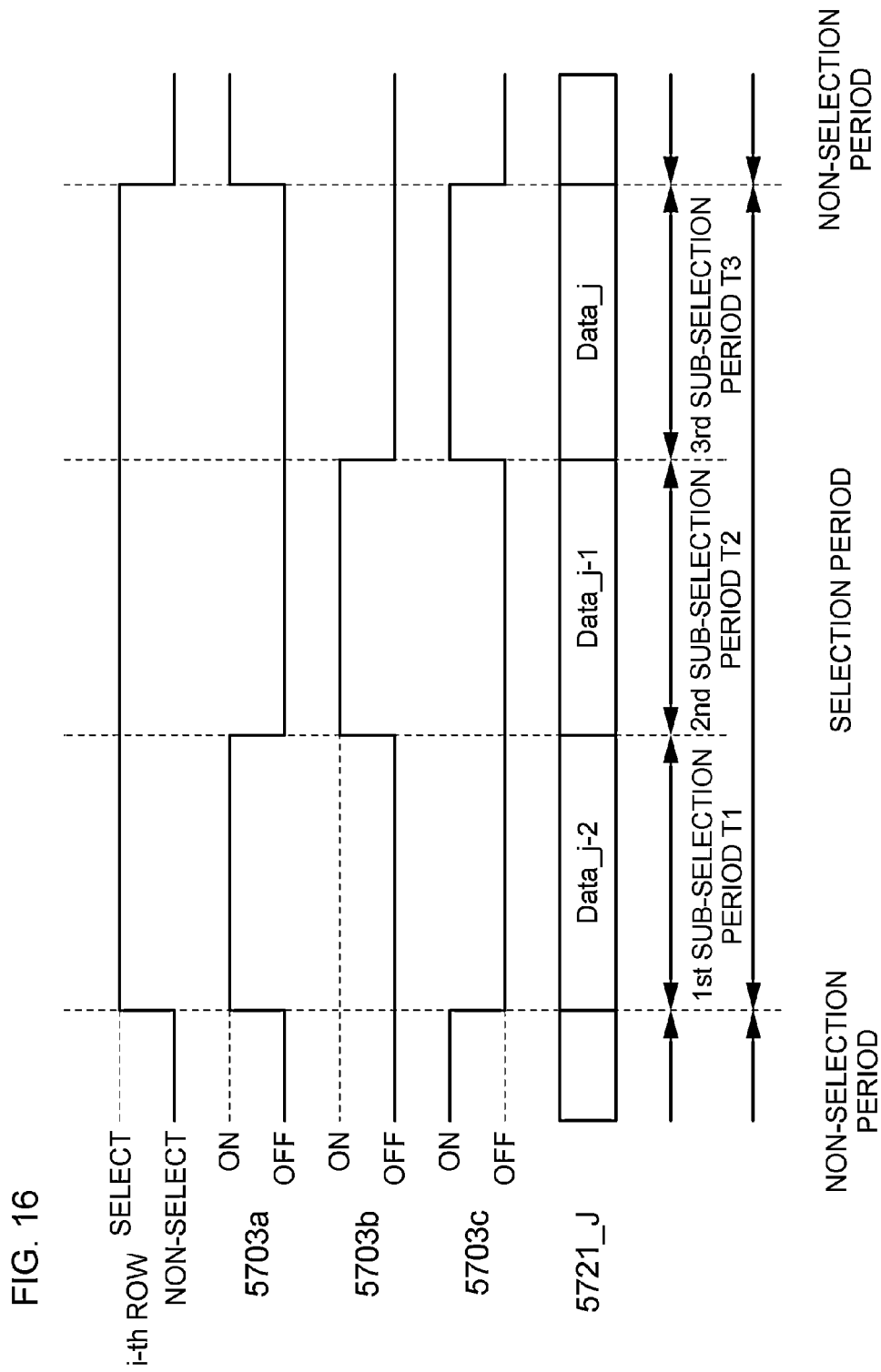
FIG. 16 is a timing chart illustrating operation of a signal line driver circuit.

Next, operation of the signal line driver circuit illustrated in FIG. 15 is described with reference to a timing chart in FIG. 16. The timing chart in FIG. 16 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 15 operates similarly to that in FIG. 16 even when a scan line of another row is selected.

Note that the timing chart in FIG. 16 shows a case where the wiring 5621_J of the J-th column is connected to the signal line Sj−2, the signal line Sj−1, and the signal line Sj via the first thin film transistor 5603a, the second thin film transistor 5603b, and the third thin film transistor 5603c.

The timing chart in FIG. 16 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−2, a video signal input to the wiring 5621_J in the second sub-selection period T2 is input to the signal line Sj−1, and a video signal input to the wiring 5621_J in the third sub-selection period T3 is input to the signal line Sj. In addition, the video signals input to the wiring 5621_J in the first sub-selection period T1, the second sub-selection period T2, and the third sub-selection period T3 are denoted by Data_j–2, Data_j–1, and Data_j.

As illustrated in FIG. 16, in the first sub-selection period T1, the first thin film transistor 5603*a* is turned on, and the second thin film transistor 5603*b* and the third thin film transistor 5603*c* are turned off. At this time, Data_j–2 input to the wiring 5621_J is input to the signal line Sj–2 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j–1 input to the wiring 5621_J is input to the signal line Sj–1 via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j input to the wiring 5621_J is input to the signal line Sj via the third thin film transistor 5603*c*.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 15 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 15.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes short. Therefore, one gate selection period is preferably divided into two or three sub-selection periods.

Figure 17:
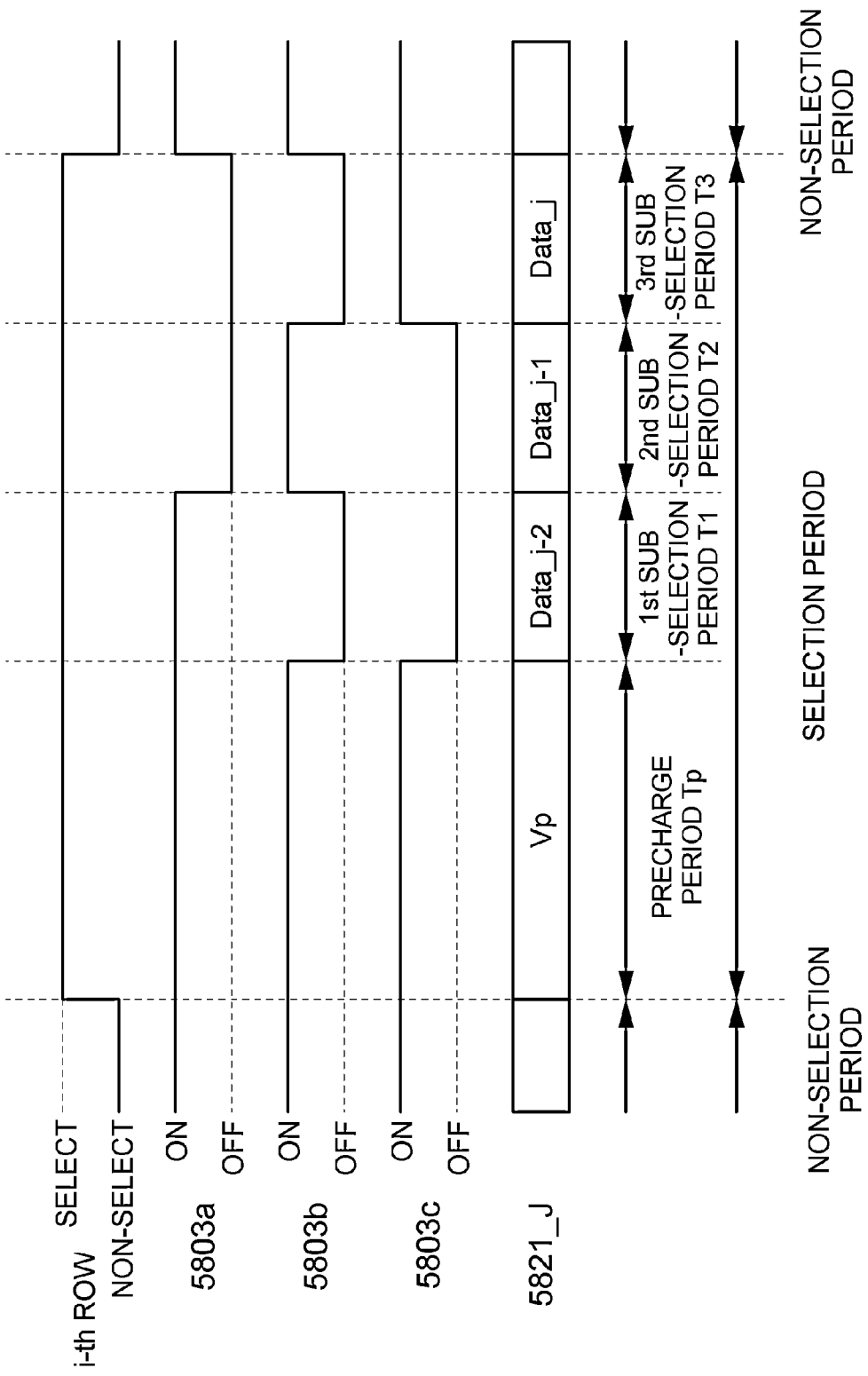
FIG. 17 is a timing chart illustrating operation of a signal line driver circuit.

As another example, one gate selection period may be divided into a precharge period Tp, the first sub-selection period T1, the second sub-selection period T2, and the third sub-selection period T3 as illustrated in a timing chart in FIG. 17. The timing chart in FIG. 17 illustrates timing at which the scan line Gi of the i-th row is selected, timing 5803*a* of on/off of the first thin film transistor 5603*a*, timing 5803*b* of on/off of the second thin film transistor 5603*b*, timing 5803*c* of on/off of the third thin film transistor 5603*c*, and a signal 5821_J input to the wiring 5621_J of the J-th column. As illustrated in FIG. 17, the first thin film transistor 5603*a*, the second thin film transistor 5603*b*, and the third thin film transistor 5603*c* are turned on in the precharge period Tp. At this time, precharge voltage Vp input to the wiring 5621_J is input to each of the signal line Sj–2, the signal line Sj–1, and the signal line Sj via the first thin film transistor 5603*a*, the second thin film transistor 5603*b*, and the third thin film transistor 5603*c*. In the first sub-selection period T1, the first thin film transistor 5603*a* is turned on, and the second thin film transistor 5603*b* and the third thin film transistor 5603*c* are turned off. At this time, Data_j–2 input to the wiring 5621_J is input to the signal line Sj–2 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j–1 input to the wiring 5621_J is input to the signal line Sj–1 via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j input to the wiring 5621_J is input to the signal line Sj via the third thin film transistor 5603*c*.

As described above, in the signal line driver circuit in FIG. 15 to which the timing chart in FIG. 17 is applied, the video signal can be written to the pixel at high speed because the signal line can be precharged by providing a precharge selection period before a sub-selection period. Note that portions in FIG. 17 which are similar to those of FIG. 16 are denoted by common reference numerals and detailed description of the same portions and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The selection signal produced is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large amount of current is used.

One mode of a shift register which is used for part of a scan line driver circuit is described with reference to FIG. 18 and FIG. 19.

Figure 18:
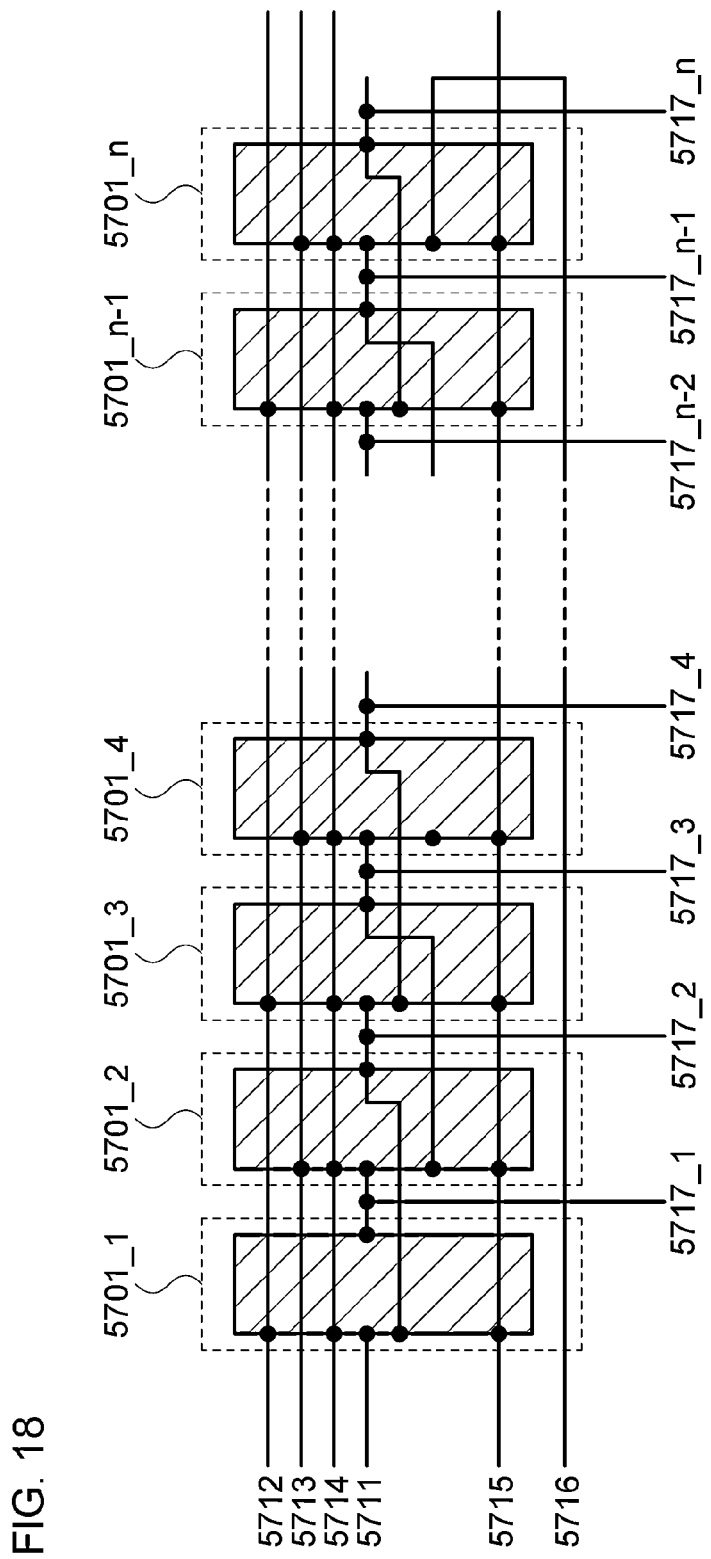
FIG. 18 is a diagram illustrating a configuration of a shift register.

FIG. 18 illustrates a circuit configuration of the shift register. The shift register illustrated in FIG. 18 includes a plurality of flip-flops, flip-flops 5701_1 to 5701_*n*. The shift register is operated with input of a first clock signal, a second clock signal, a start pulse signal, and a reset signal.

The connection relation of the shift register illustrated in FIG. 18 is described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5717_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, the flip-flop 5701_*i* (any one of the flip-flops 5701_1 to 5701_*n*) of an i-th stage is connected to one of the second wiring 5712 and the third wiring 5713, the fourth wiring 5714, the fifth wiring 5715, a seventh wiring 5717_*i*–1, a seventh wiring 5717_*i*, and a seventh wiring 5717_*i*+1. Here, when the "i" is an odd number, the flip-flop 5701_*i* of the i-th stage is connected to the second wiring 5712; when the "i" is an even number, the flip-flop 5701_*i* of the i-th stage is connected to the third wiring 5713.

The flip-flop 5701_*n* of an n-th stage is connected to one of the second wiring 5712 and the third wiring 5713, the fourth wiring 5714, the fifth wiring 5715, a seventh wiring 5717_*n*–1, the seventh wiring 5717_*n*, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Figure 19:
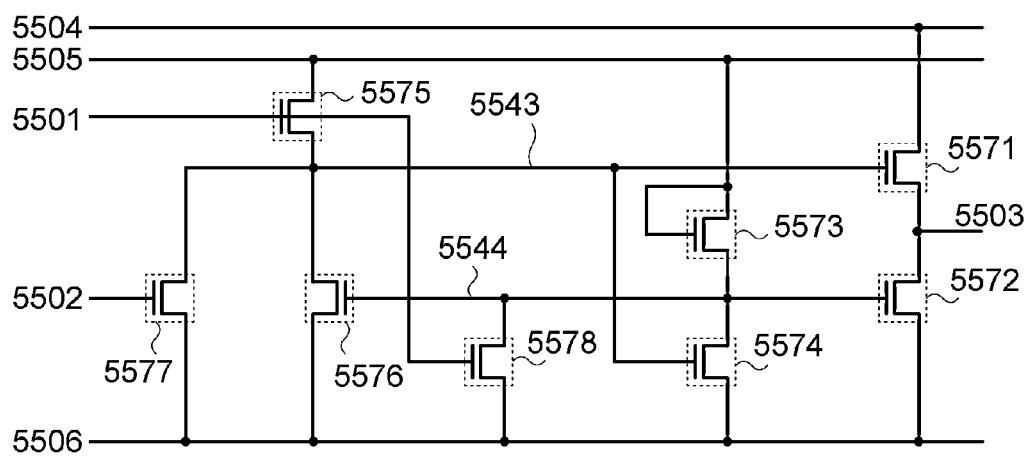
FIG. 19 is a diagram illustrating a connection structure of a flip-flop in FIG. 18.

Next, FIG. 19 illustrates details of the flip-flop illustrated in FIG. 18. A flip-flop illustrated in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In addition, the flip-flop illustrated in FIG. 19 includes a first wiring 5501, a second wiring 5502, a third wiring 5503, a fourth wiring 5504, a fifth wiring 5505, and a sixth wiring 5506.

Note that all thin film transistors here are enhancement-mode n-channel transistors; however, the present invention is not limited thereto. For example, the driver circuit can be operated using depression-mode n-channel transistors.

Next, connections of the flip-flop illustrated in FIG. 18 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the flip-flop 5701_i of the i-th stage, the first wiring 5501 in FIG. 19 is connected to the seventh wiring 5717_i−1 in FIG. 18. The second wiring 5502 in FIG. 19 is connected to the seventh wiring 5717_i+1 in FIG. 18. The third wiring 5503 in FIG. 19 is connected to the seventh wiring 5717_i. The sixth wiring 5506 in FIG. 19 is connected to the fifth wiring 5715.

If the "i" is an odd number, the fourth wiring 5504 in FIG. 19 is connected to the second wiring 5712 in FIG. 18; if the "i" is an even number, the fourth wiring 5504 in FIG. 19 is connected to the third wiring 5713 in FIG. 18. In addition, the fifth wiring 5505 in FIG. 19 is connected to the fourth wiring 5714 in FIG. 18.

Note that in the flip-flop 5701_1 of the first stage, the first wiring 5501 in FIG. 19 is connected to the first wiring 5711 in FIG. 18. In addition, in the flip-flop 5701_n of the n-th stage, the second wiring 5502 in FIG. 19 is connected to the sixth wiring 5716 in FIG. 18.

In addition, the signal line driver circuit and the scan line driver circuit can be formed using only the n-channel TFTs described in any of Embodiments 1 to 3. The n-channel TFT described in any of Embodiments 1 to 3 has high mobility, and thus a driving frequency of a driver circuit can be increased. Further, parasitic capacitance is reduced by the source or drain region which is an In—Ga—Zn—O-based non-single-crystal film; thus, the n-channel TFT described in any of Embodiments 1 to 3 has high frequency characteristics (referred to as f characteristics). For example, a scan line driver circuit using the n-channel TFT described in any of Embodiments 1 to 3 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, increase in frame frequency can be realized. Furthermore, the use of the plurality of scan line driver circuits for output of signals to the same scan line is advantageous in increasing the size of a display device.

Figure 14B:
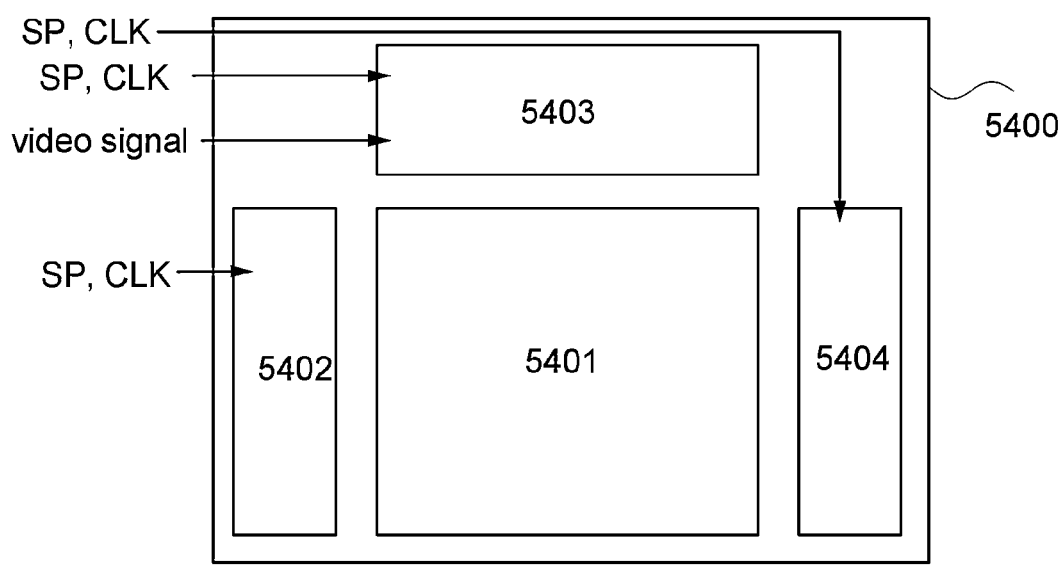

Further, when an active matrix light-emitting display device which is an example of a semiconductor device is manufactured, a plurality of thin film transistors are arranged in at least one pixel, and thus a plurality of scan line driver circuits are preferably arranged. FIG. 14B is a block diagram illustrating an example of an active matrix light-emitting display device.

The light-emitting display device illustrated in FIG. 14B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 14B is a digital signal, a pixel is in a light-emitting state or in a non-light-emitting state by switching of ON/OFF of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. A time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of displaying with a time gray scale method, one frame period is divided into a plurality of subframe periods. Then, in accordance with video signals, the light-emitting element in the pixel is set in a light-emitting state or in a non-light-emitting state during each subframe period. By dividing one frame into a plurality of subframes, the total length of time, in which pixels actually emit light in one frame period, can be controlled with video signals so that gray scales are displayed.

In the example of the light-emitting display device illustrated in FIG. 14B, in a case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other of the switching TFTs; however, one scan line driver circuit may generate both the signal which is input to the first scan line and the signal which is input to the second scan line. In addition, for example, there is a possibility that a plurality of scan lines used for controlling the operation of the switching elements be provided in each pixel depending on the number of switching TFTs included in one pixel. In that case, one scan line driver circuit may generate all signals that are input to the plurality of scan lines, or a plurality of scan line driver circuits may generate signals that are input to the plurality of scan lines.

In addition, also in the light-emitting display device, part of the driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in Embodiment 2.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region.

A solution in which the aforementioned microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained with the thin film transistor described in Embodiment 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above steps, a highly reliable display device as a semiconductor device can be manufactured.

Note that the structure described in this embodiment can be combined with any of the structures described in another embodiment as appropriate.

[Embodiment 5]

The thin film transistor described in any of Embodiments 1 to 3 is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using the thin film transistor described in any of Embodiments 1 to 3, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. An embodiment of the present invention relates to one embodiment of an element substrate before the display element is completed in a manufacturing process of the display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, the appearance and a cross section of a liquid crystal display panel, which is one embodiment of a semiconductor device, will be described with reference to FIGS. 22A-1 to 22B. FIGS. 22A-1 and 22A-2 are top views of a panel in which highly reliable thin film transistors 4010 and 4011 each including the In—Ga—Zn—O-based non-single-crystal film described in any of Embodiments 1 to 3 as an oxide semiconductor layer, and a liquid crystal element 4013 formed over a first substrate 4001 are sealed between the first substrate 4001 and a second substrate 4006 with a sealant 4005. FIG. 22B is a cross-sectional view taken along line M-N of FIGS. 22A-1 and 22A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 22A-1 illustrates an example of mounting the signal line driver circuit 4003 by a COG method, and FIG. 22A-2 illustrates an example of mounting the signal line driver circuit 4003 by a TAB method.

The pixel portion 4002 and the scan line driver circuit 4004 provided over the first substrate 4001 include a plurality of thin film transistors. FIG. 22B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

The highly reliable thin film transistor including an In—Ga—Zn—O-based non-single-crystal film as an oxide semiconductor layer, which is described in any of Embodiments 1 to 3, can be applied to each of the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used. The counter electrode layer 4031 is electrically connected to a common potential line provided over the same substrate as the thin film transistor 4010. With the use of the common connection portion, the counter electrode layer 4031 is electrically connected to the common potential line through conductive particles provided between the pair of substrates. Note that the conductive particles are contained in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 10 µs to 100 µs, which is short, the alignment process is unnecessary because the liquid crystal composition has optical isotropy, and viewing angle dependency is small.

Although an example of a transmissive liquid crystal display device is described in this embodiment, it can also be applied to a reflective liquid crystal display device and a transflective liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing steps. Further, a light-blocking film serving as a black matrix may be provided.

In this embodiment, in order to reduce surface unevenness of the thin film transistor and to improve reliability of the thin film transistor, the thin film transistor obtained in any of Embodiments 1 to 3 is covered with the insulating layers (the insulating layer 4020 and the insulating layer 4021) functioning as a protective film or a planarizing insulating film. Note that the protective film is provided to prevent entry of contaminant impurities such as an organic substance, a metal, or moisture floating in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, the present invention is not limited to this example, and the protective film may be formed by a variety of methods.

In this embodiment, the insulating layer 4020 having a stacked-layer structure is formed as a protective film. Here, as a first layer of the insulating layer 4020, a silicon oxide film is formed by a sputtering method. The use of a silicon oxide film as a protective film has an effect of preventing hillock of an aluminum film used as the source and drain electrode layers.

As a second layer of the protective film, an insulating layer is formed. In this embodiment, as the second layer of the insulating layer 4020, a silicon nitride film is formed by a sputtering method. The use of the silicon nitride film as the protective film can prevent mobile ions of sodium or the like from entering a semiconductor region so that variation in electrical characteristics of the TFT can be suppressed.

After the protective film is formed, the oxide semiconductor layer may be subjected to annealing (300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane material as a starting material and having the bond of Si—O—Si. The siloxane-based resin may include an organic group (such as an alkyl group and an aryl group) or a fluoro group as a substituent. The organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case of forming the insulating layer 4021 using a material solution, annealing (300° C. to 400° C.) of the oxide semiconductor layer may be performed at the same time as a baking step. The baking step of the insulating layer 4021 also serves as annealing of the oxide semiconductor layer, whereby a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

A conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohm/square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 through an anisotropic conductive film 4019.

FIGS. 22A-1 to 22B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 23:
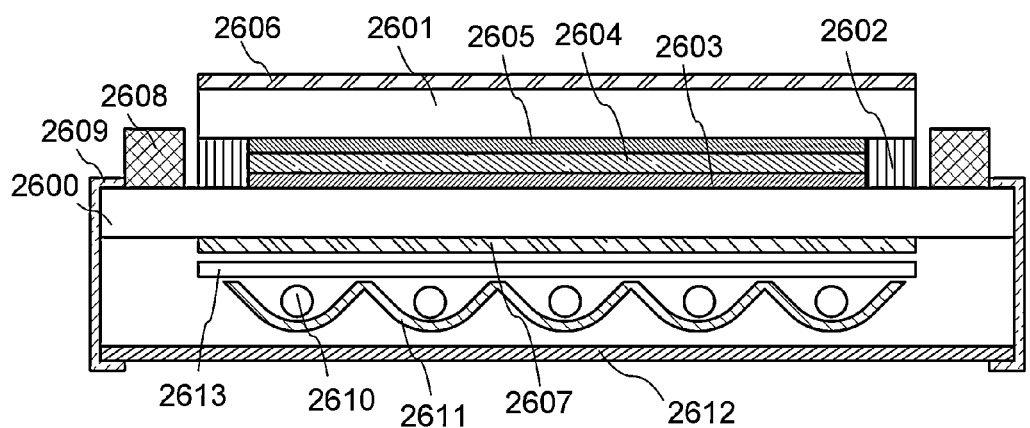
FIG. 23 is a diagram illustrating a semiconductor device according to an embodiment of the present invention.

FIG. 23 illustrates an example in which a liquid crystal display module is formed as a semiconductor device by using a TFT substrate 2600 manufactured by application of the TFT described in any of Embodiments 1 to 3.

FIG. 23 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through this process, a highly reliable liquid crystal display panel as a semiconductor device can be manufactured.

Note that the structure described in this embodiment can be combined with any of the structures described in another embodiment as appropriate.

[Embodiment 6]

In this embodiment, an example of electronic paper will be described as a semiconductor device to which the thin film transistor described in any of Embodiments 1 to 3 is applied.

Figure 13:
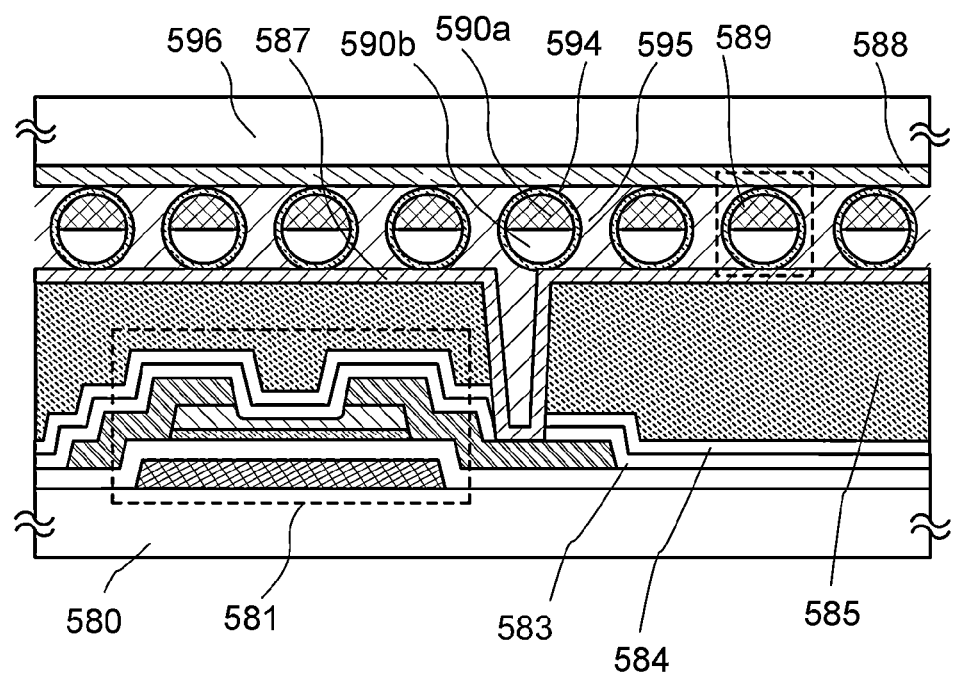
FIG. 13 is a diagram illustrating a semiconductor device according to an embodiment of the present invention.

FIG. 13 illustrates active matrix electronic paper as an example of a semiconductor device. A thin film transistor 581 used for the semiconductor device can be manufactured by application of the thin film transistor described in any of Embodiments 1 to 3.

The electronic paper in FIG. 13 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 which is sealed between a substrate 580 and a substrate 596 is a thin film transistor with a bottom gate structure, and a source or drain electrode layer thereof is in contact with a first electrode layer 587 through an opening formed in insulating layers 583, 584 and 585, whereby the thin film transistor 581 is electrically connected to the first electrode layer 587. Between the first electrode layer 587 and a second electrode layer 588, spherical particles 589 each having a black region 590$a$, a white region 590$b$, and a cavity 594 around the regions which is filled with liquid are provided. A space around the spherical particles 589 is filled with a filler 595 such as a resin (see FIG. 13). In this embodiment, the first electrode layer 587 corresponds to the pixel electrode and the second electrode layer 588 corresponds to the common electrode. The second electrode layer 588 is electrically connected to a common potential line provided over the same substrate as the thin film transistor 581. With the use of the common connection portion, the second electrode layer 588 is electrically connected to the common potential line through conductive particles provided between the pair of substrates.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper as a semiconductor device can be manufactured.

Note that the structure described in this embodiment can be combined with any of the structures described in another embodiment as appropriate.

[Embodiment 7]

In this embodiment, an example of a light-emitting display device will be described as a semiconductor device to which the thin film transistor described in any of Embodiments 1 to 3 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 20:
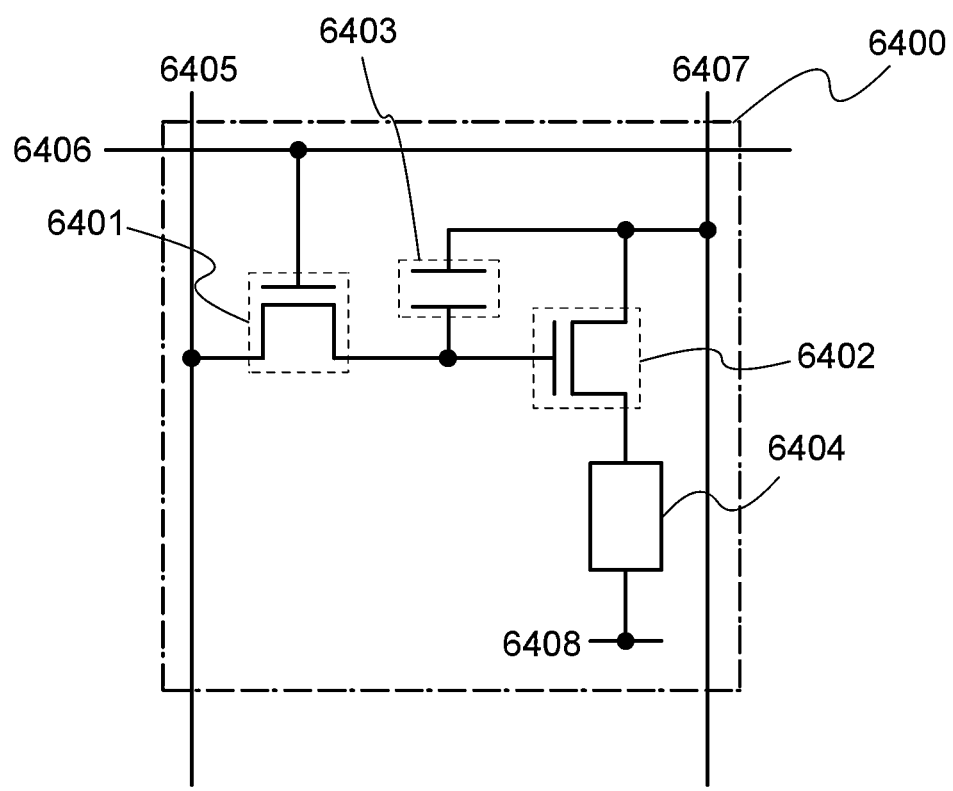
FIG. 20 is a diagram illustrating a pixel equivalent circuit of a semiconductor device according to an embodiment of the present invention.

FIG. 20 illustrates an example of a pixel structure to which digital time grayscale driving can be applied, as an example of a semiconductor device to which an example of the present invention is applied.

A structure and operation of a pixel to which digital time grayscale driving can be applied are described. Here, one pixel includes two n-channel transistors each of which includes an oxide semiconductor layer (an In—Ga—Zn—O-based non-single-crystal film) in a channel formation region and each of which is described in any of Embodiments 1 to 3.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the structure illustrated in FIG. 1A, FIG. 2A, or FIG. 3A may be obtained using the connection portion as a common connection portion.

The second electrode (the common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

In the case of performing analog grayscale driving instead of digital time grayscale driving, the same pixel structure as that in FIG. 20 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 20 is not limited thereto. For example, a switch, a resistor, a capacitor, a transistor, a logic circuit, or the like may be added to the pixel illustrated in FIG. 20.

Next, structures of the light-emitting element will be described with reference to FIGS. 21A to 21C. A cross-sectional structure of a pixel will be described by taking an n-channel driving TFT as an example. Driving TFTs 7001, 7011, and 7021 used for semiconductor devices illustrated in FIGS. 21A to 21C can be formed in a manner similar to formation of the thin film transistor described in any of Embodiments 1 to 3 and are highly reliable thin film transistors each including an In—Ga—Zn—O-based non-single-crystal film as an oxide semiconductor layer.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure of an example of the present invention can be applied to a light-emitting element having any of these emission structures.

A light-emitting element having a top emission structure will be described with reference to FIG. 21A.

Figure 21A:
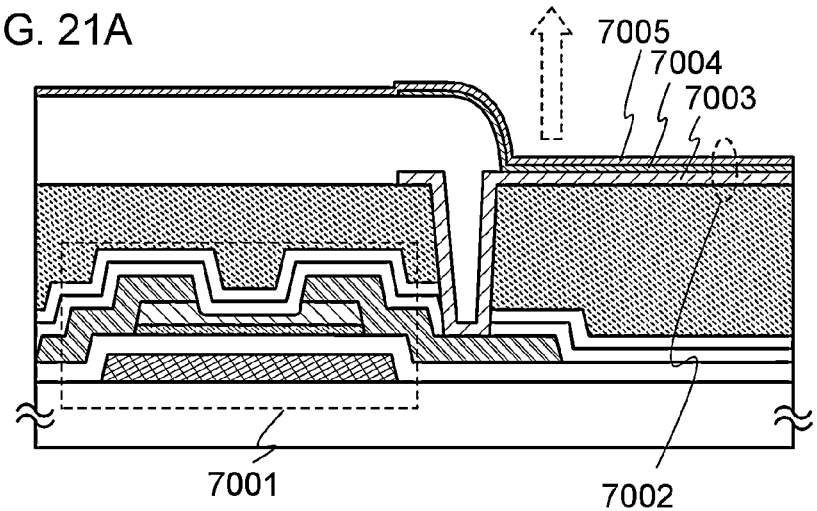
FIGS. 21A to 21C are diagrams each illustrating a semiconductor device according to an embodiment of the present invention.

FIG. 21A is a cross-sectional view of a pixel in the case where the driving TFT 7001 is an n-channel TFT and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure will be described with reference to FIG. 21B. FIG. 21B is a cross-sectional view of a pixel in the case where the driving TFT 7011 is an n-channel transistor and light is emitted from a light-emitting element 7012 to a cathode 7013 side. In FIG. 21B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 21A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. In a manner similar to the case of FIG. 21A, the light-emitting layer 7014 may be formed using either a single layer or a plurality of layers stacked. The anode 7015 is not required to transmit light, but can be formed using a light-transmitting conductive material as in the case of FIG. 21A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 21A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 21A, the light-emitting layer 7024 may be formed using either a single layer or a plurality of layers stacked. The anode 7025 can be formed using a light-transmitting conductive material as in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
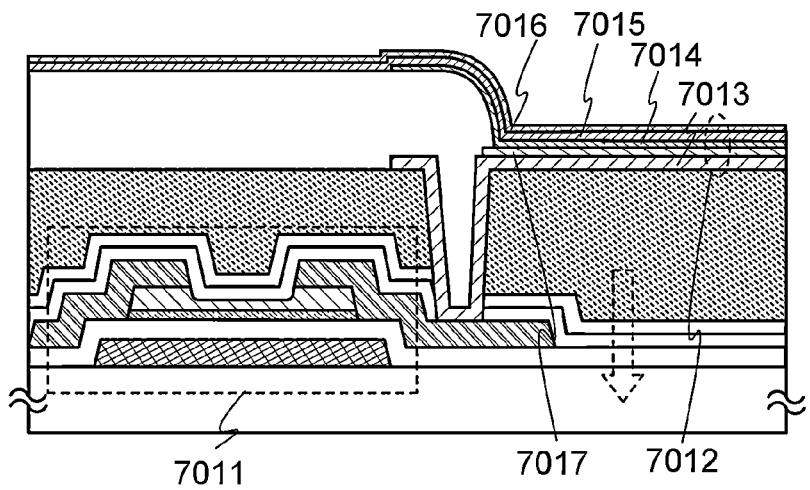
Figure 21C:
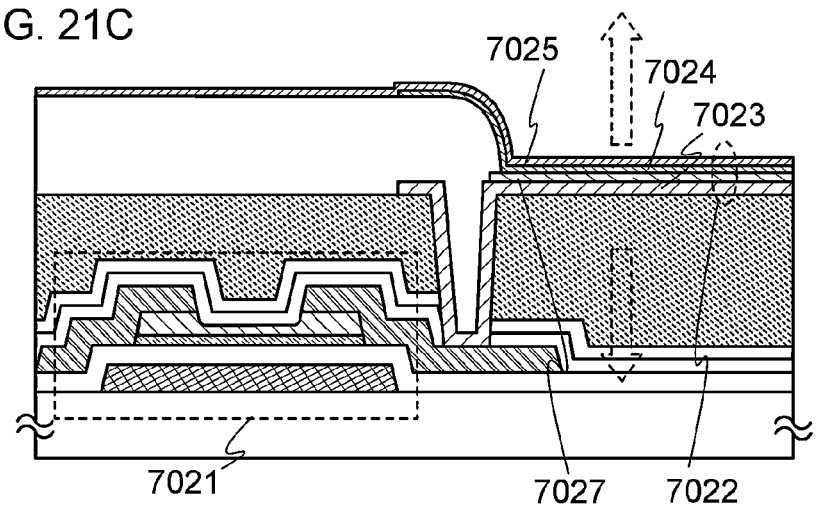

A semiconductor device described in this embodiment is not limited to the structures illustrated in FIGS. 21A to 21C and can be modified in various ways based on the spirit of techniques according to the present invention.

Next, the appearance and a cross section of a light-emitting display panel (also referred to as a light-emitting panel), which is one embodiment of a semiconductor device to which the thin film transistor described in any of Embodiments 1 to 3 is applied, will be described with reference to FIGS. 24A and 24B. FIG. 24A is a top view of a panel in which a thin film transistor and a light-emitting element formed over a first substrate are sealed between the first substrate and a second substrate with a sealant. FIG. 24B is a cross-sectional view taken along line H-I of FIG. 24A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 24B.

The highly reliable thin film transistor including an In—Ga—Zn—O-based non-single-crystal film as an oxide semiconductor layer, which is described in any of Embodiments 1 to 3, can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, an electroluminescent layer 4512, and a second electrode layer 4513, but the present invention is not limited to that described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518*a* through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be provided as driver circuits formed using a single crystal semiconductor film or polycrystalline semiconductor film over a substrate separately prepared. In addition, only the signal line driver circuits or part thereof, or only the scan line driver circuits or part thereof may be separately formed and mounted. This embodiment is not limited to the structure illustrated in FIGS. 24A and 24B.

Through this process, a highly reliable light-emitting display device (display panel) as a semiconductor device can be manufactured.

Note that the structure described in this embodiment can be combined with any of the structures described in another embodiment as appropriate.

[Embodiment 8]

A semiconductor device to which the thin film transistor described in any of Embodiments 1 to 3 is applied can be used as electronic paper. Electronic paper can be used for electronic devices of a variety of fields as long as they can display data. For example, electronic paper can be applied to an electronic book (e-book) reader, a poster, an advertisement in a vehicle such as a train, displays of various cards such as a credit card, and the like. Examples of the electronic devices are illustrated in FIGS. 25A and 25B and FIG. 26.

Figure 25A:
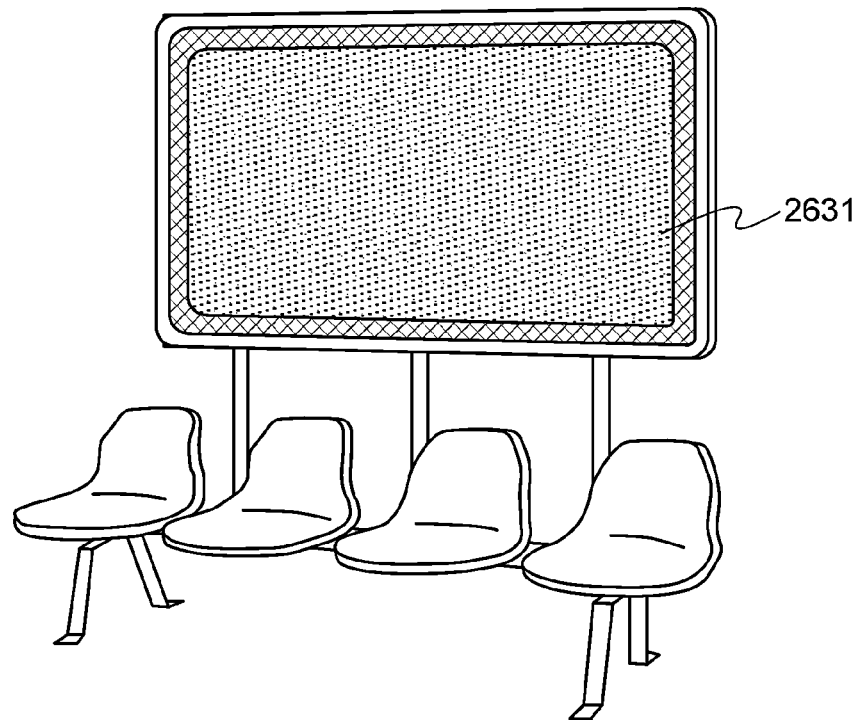
FIGS. 25A and 25B are diagrams each illustrating an example of a usage pattern of electronic paper.

FIG. 25A illustrates a poster 2631 formed using electronic paper. In the case where an advertising medium is printed paper, the advertisement is replaced by manpower; however, by using electronic paper, the advertising display can be changed in a short time. Further, an image can be stably displayed without being distorted. Note that the poster may be configured to transmit and receive data wirelessly.

Figure 25B:
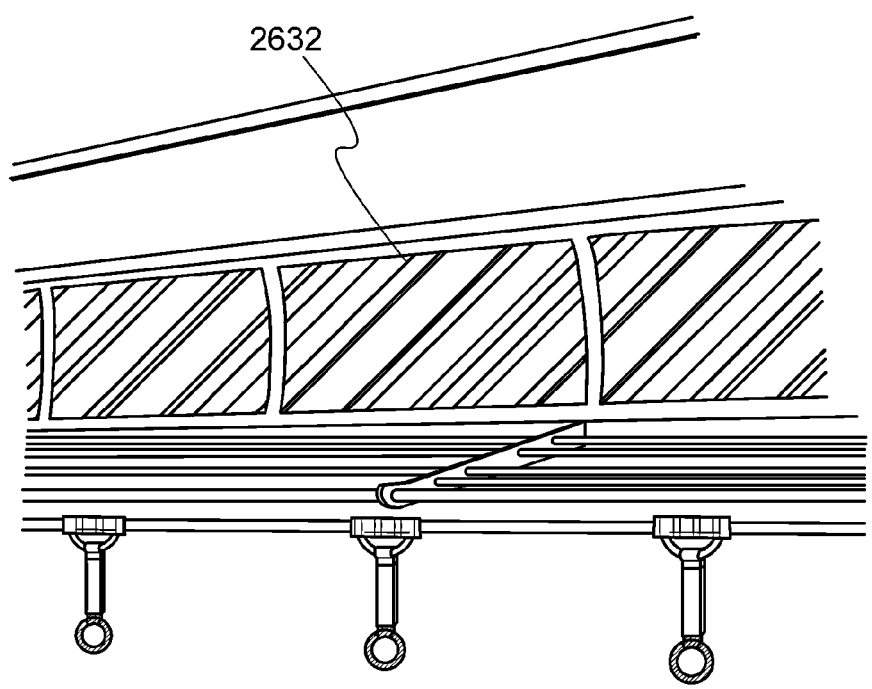

FIG. 25B illustrates an advertisement 2632 in a vehicle such as a train. In the case where an advertising medium is printed paper, the advertisement is replaced by manpower; however, by using electronic paper, the advertising display can be changed in a short time without a lot of manpower. Further, an image can be stably displayed without being distorted. Note that the advertisement in a vehicle may be configured to transmit and receive data wirelessly.

Figure 26:
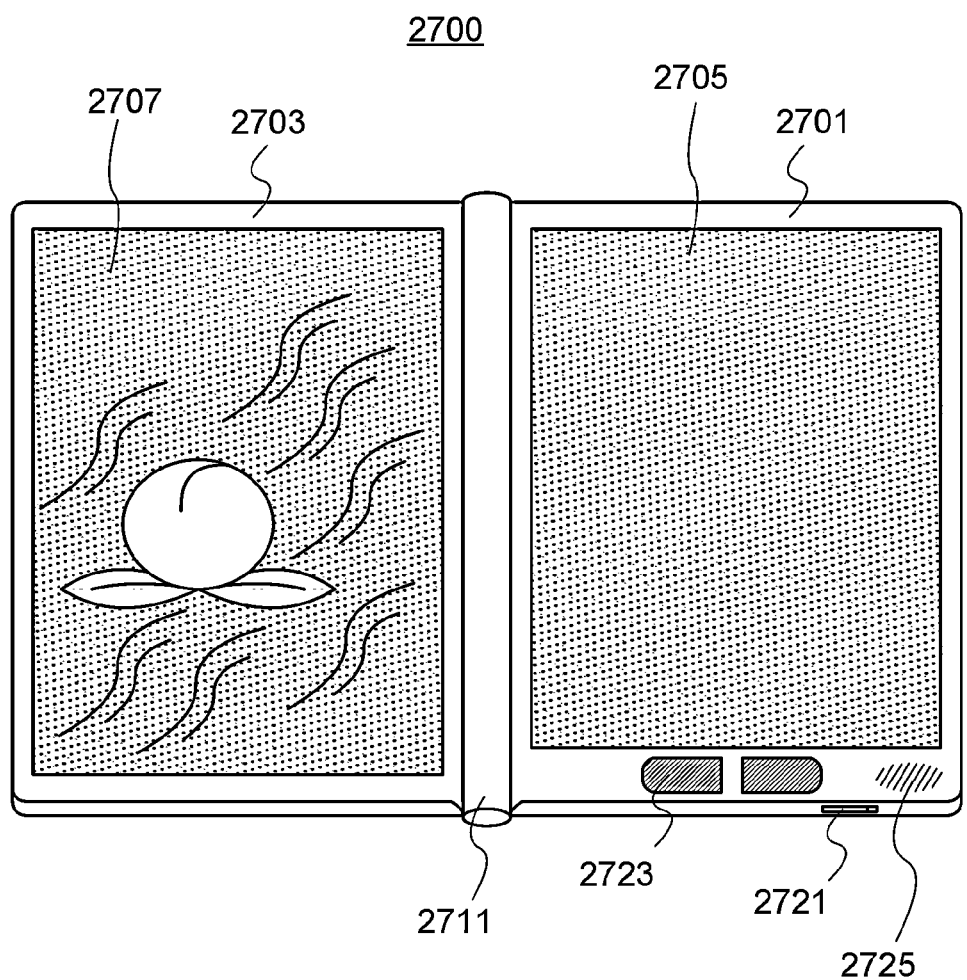
FIG. 26 is an external view of an example of an electronic book reader.

FIG. 26 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 26) can display text and a display portion on the left side (the display portion 2707 in FIG. 26) can display graphics.

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

Note that the structure described in this embodiment can be combined with any of the structures described in another embodiment as appropriate.

[Embodiment 9]

A semiconductor device using the thin film transistor described in any of Embodiments 1 to 3 can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 27A:
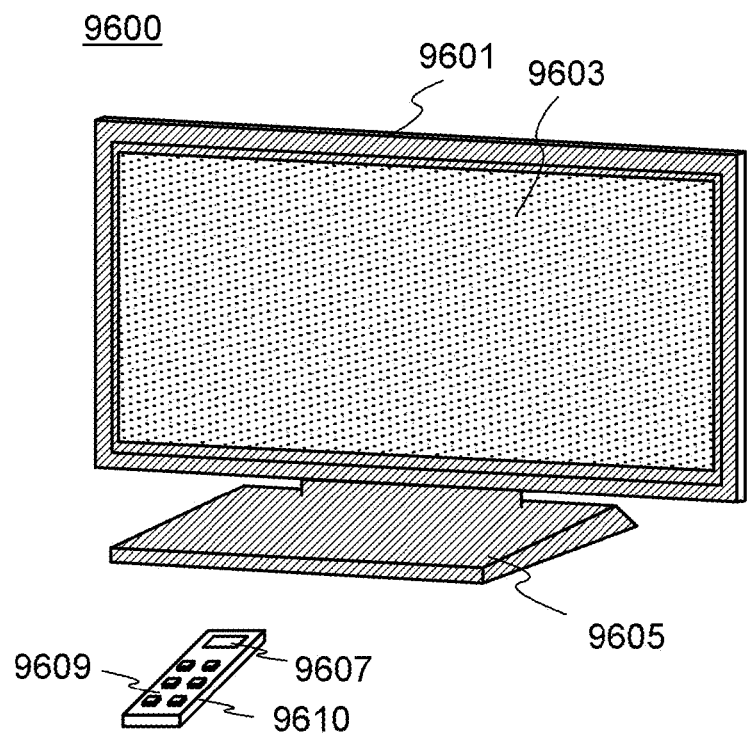
FIG. 27A is an external view of an example of a television device and FIG. 27B is an external view of an example of a digital photo frame.

FIG. 27A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 27B:
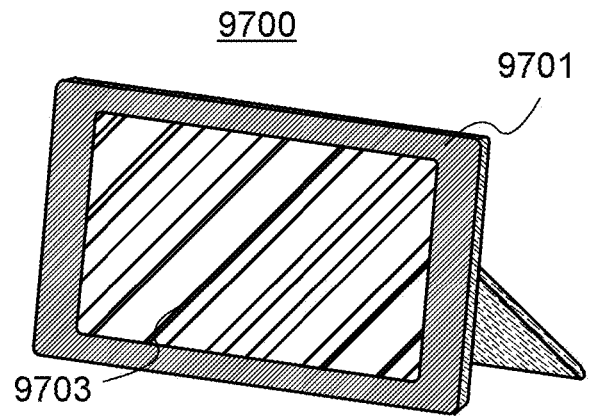

FIG. 27B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 28A:
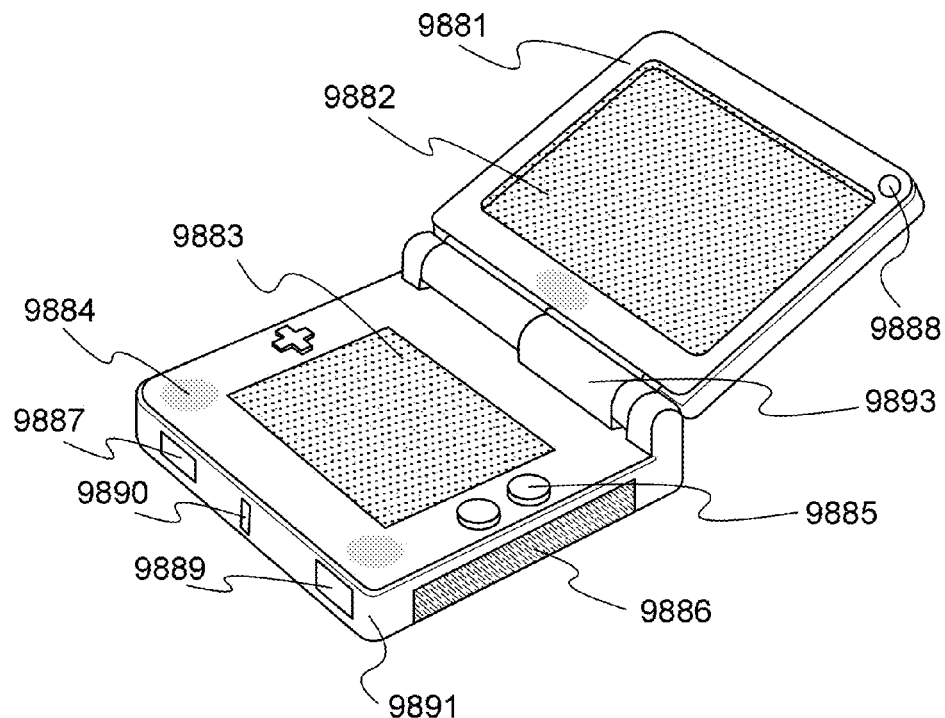
FIGS. 28A and 28B are external views each illustrating an example of an amusement machine.

FIG. 28A is a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 28A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device according to an example of the present invention is provided. The portable game machine illustrated in FIG. 28A has a function of reading a program or data stored in a recording medium to display it on the display portion, and a function of sharing information with another portable game machine by wireless communication. Note that a function of the portable game machine illustrated in FIG. 28A is not limited to those described above, and the portable game machine can have a variety of functions.

Figure 28B:
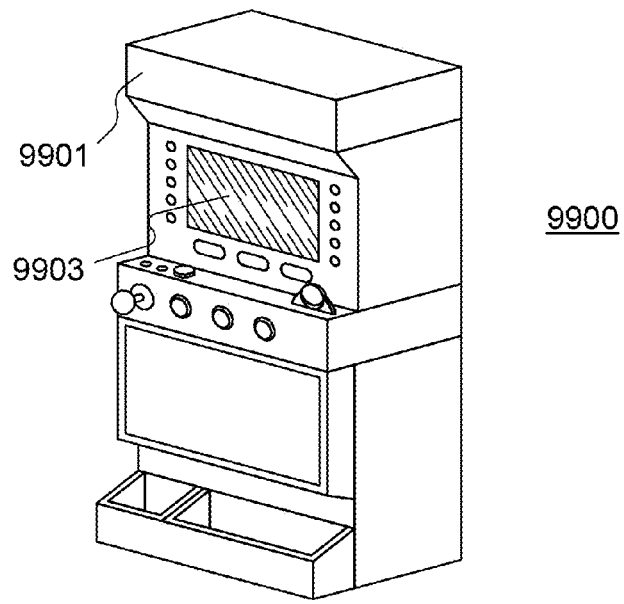

FIG. 28B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least a semiconductor device according to an example of the present invention is provided.

Figure 29A:
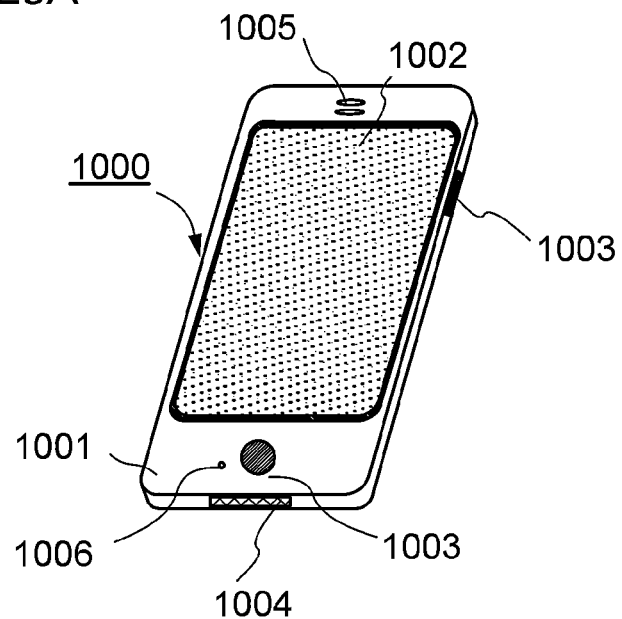
FIGS. 29A and 29B are diagrams each illustrating an example of a mobile phone.

FIG. 29A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 29A is touched with a finger or the like, data can be input into the mobile phone handset 1000.

Further, operation such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that characters displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are changed by touching the display portion 1002 or using the operation buttons 1003 of the housing 1001. Alternatively, the screen modes may be changed depending on the kind of the image displayed on the display portion 1002. For example, when a signal of an image displayed on the display portion is the one of moving image data, the screen mode is changed to the display mode. When the signal is the one of text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 29B:
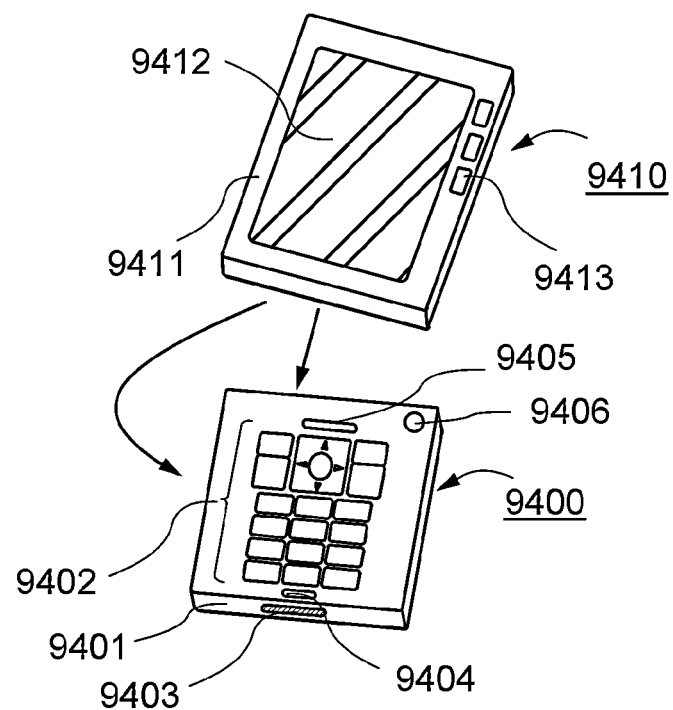

FIG. 29B illustrates another example of a cellular phone. The cellular phone in FIG. 29B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function by moving in two directions represented by allows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in another embodiment as appropriate.

EXAMPLE 1

In this example, results in which dependence of electrical conductivity of an oxide semiconductor film on the proportion of the flow rate of an oxygen gas during film formation is measured are described.

In this example, In—Ga—Zn—O-based non-single-crystal films were formed by a sputtering method, and the electrical conductivity of the formed In—Ga—Zn—O-based non-single-crystal films was measured. Samples were formed under a condition where the proportion of the flow rate of an oxygen gas during film formation was changed from 0 volume % to 100 volume % among the samples, and each electrical conductivity of the In—Ga—Zn—O-based non-single-crystal films formed by varying the proportion of the flow rate of the oxygen gas among the samples was measured. Note that the electrical conductivity was measured using a semiconductor parameter analyzer HP4155C (made by Agilent Technologies Inc.).

The In—Ga—Zn—O-based non-single-crystal films were formed by sputtering, with use of a disk-shaped oxide semiconductor target of 8 inches in diameter, in which $In_2O_3$, $Ga_2O_3$, and $ZnO$ are mixed in the ratio of $In_2O_3:Ga_2O_3:ZnO=1:1:1$ (In:G:Zn=1:1:0.5), as a target. As other film formation conditions, the distance between a substrate and the target was set to 170 mm; the pressure for a film-forming gas was set to 0.4 Pa; the direct-current (DC) power source was set to 0.5 kW; and the formation temperature was set to room temperature.

As a film-forming gas, an argon gas and an oxygen gas were used. Film formation was performed under the condition where the proportion of the flow rate of the oxygen gas in the argon gas and the oxygen gas was changed from 0 volume % to 100 volume % among the samples, and each electrical conductivity of the In—Ga—Zn—O-based non-single-crystal films was measured. Note that, in order to perform rearrangement at the atomic level on each of the In—Ga—Zn—O-based non-single-crystal films, heat treatment at 350° C. in a nitrogen atmosphere was performed for one hour after each of the In—Ga—Zn—O-based non-single-crystal films was formed.

Figure 12:
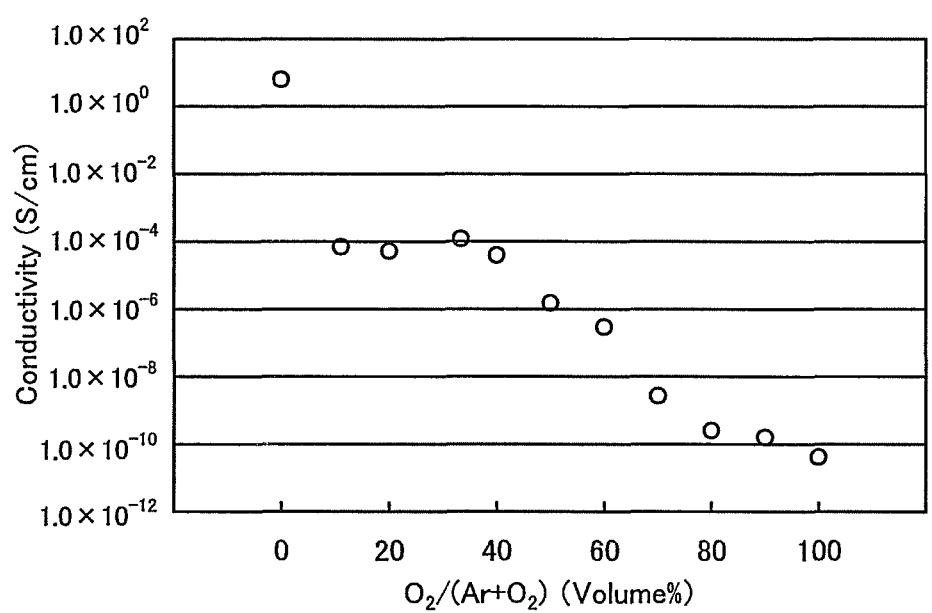
FIG. 12 is a graph showing measurement results of electrical conductivity of an oxide semiconductor layer.

Each electrical conductivity of the In—Ga—Zn—O-based non-single-crystal films formed by varying the proportion of the flow rate of the oxygen gas among the samples is shown in FIG. 12. In FIG. 12, the horizontal axis represents the proportion of the flow rate of the oxygen gas (volume %) in the flow rate of the argon gas and the flow rate of the oxygen gas, and the vertical axis represents the electrical conductivity (S/cm) of the In—Ga—Zn—O-based non-single-crystal films. Further, Table 1 is a table corresponding to FIG. 12, and shows the flow rate of the argon gas (sccm), the flow rate of the oxygen gas (sccm), the proportion of the flow rate of the oxygen gas (volume %), and the electrical conductivity of each of the In—Ga—Zn—O-based non-single-crystal films (S/cm).

TABLE 1

| Ar (sccm) | $O_2$ (sccm) | Proportion of flow rate of oxygen gas (volume %) | Conductivity (S/cm) |
|---|---|---|---|
| 50 | 0 | 0 | $6.44 \times 10^0$ |
| 40 | 5 | 11.1 | $7.01 \times 10^{-5}$ |
| 40 | 10 | 20 | $5.24 \times 10^{-5}$ |
| 30 | 15 | 33.3 | $1.23 \times 10^{-4}$ |
| 30 | 20 | 40 | $3.98 \times 10^{-5}$ |
| 25 | 25 | 50 | $1.52 \times 10^{-6}$ |
| 20 | 30 | 60 | $2.92 \times 10^{-7}$ |
| 15 | 35 | 70 | $2.68 \times 10^{-9}$ |
| 10 | 40 | 80 | $2.57 \times 10^{-10}$ |
| 5 | 45 | 90 | $1.59 \times 10^{-10}$ |
| 0 | 50 | 100 | $4.19 \times 10^{-11}$ |

From the results in FIG. 12 and Table 1, when the proportion of the flow rate of the oxygen gas is 0 volume % to 11.1 volume %, the electrical conductivity is significantly decreased; when the proportion of the flow rate of the oxygen gas is 11.1 volume % to 40 volume %, the electrical conductivity is about $1.0 \times 10^{-5}$ S/cm to $1.0 \times 10^{-4}$ S/cm; and when the proportion of the flow rate of the oxygen gas is 40 volume % or higher, the electrical conductivity is gradually decreased. Note that, when the proportion of the flow rate of the oxygen gas is 60 volume % to 70 volume %, decrease in the electrical conductivity is comparatively large. Here, the maximum value of the electrical conductivity is 6.44 S/cm under the condition where the proportion of the flow rate of the oxygen gas is 0 volume %, that is, under the condition where only the argon gas is used as the film-forming gas. The minimum value of the electrical conductivity is $4.19 \times 10^{-11}$ S/cm under the condition where the proportion of the flow rate of the oxygen gas is 100 volume %, that is, under the condition where only the oxygen gas is used as the film-forming gas.

For formation of the semiconductor layer having higher electrical conductivity and the oxide semiconductor layer having lower electrical conductivity, the condition of the flow rate of the oxygen gas is differentiated from each other at around 10 volume % as a boundary, where gradient of the electrical conductivity is steep in a graph of FIG. 12, whereby difference in the electrical conductivity between the semiconductor layer and the oxide semiconductor layer can be made large. Therefore, when the In—Ga—Zn—O-based non-single-crystal film used for the semiconductor layer having high electrical conductivity is formed, the proportion of the flow rate of the oxygen gas is preferably set to lower than 10 volume %, that is, the electrical conductivity is preferably higher than $1.0 \times 10^{-3}$ S/cm. In addition, when the In—Ga—Zn—O-based non-single-crystal film used for the oxide semiconductor layer having lower electrical conductivity than the semiconductor layer is formed, the proportion of the flow rate of the oxygen gas is preferably set to 10 volume % or higher, that is, the electrical conductivity is preferably $1.0 \times 10^{-3}$ S/cm or lower.

Alternatively, a boundary may be set around 70 volume % of the proportion of the flow rate of the oxygen gas in the graph of FIG. 12 where decrease in the electrical conductivity is comparatively large. In this case, when the In—Ga—Zn—O-based non-single-crystal film used for the semiconductor layer having high electrical conductivity is formed, the proportion of the flow rate of the oxygen gas is preferably set to lower than 70 volume %, that is, the electrical conductivity is preferably higher than $1.0 \times 10^{-8}$ S/cm. Further, when the In—Ga—Zn—O-based non-single-crystal film used for the oxide semiconductor layer having lower electrical conductivity than the semiconductor layer is formed, the proportion of the flow rate of the oxygen gas is preferably set to 70 volume % or higher, that is, the electrical conductivity is preferably $1.0 \times 10^{-8}$ S/cm or lower.

This application is based on Japanese Patent Application serial no. 2008-281174 filed with Japan Patent Office on Oct. 31, 2008, the entire contents of which are hereby incorporated by reference.

What is claimed is:

1. A method of manufacturing a semiconductor device comprising the steps of:
   forming a gate insulating film over a gate electrode;
   forming a first non-single crystalline oxide semiconductor film comprising indium over the gate electrode with the gate insulating film interposed therebetween;
   forming a second non-single crystalline oxide semiconductor film comprising indium over the first non-single crystalline oxide semiconductor film, the second non-single crystalline oxide semiconductor film having a lower electrical conductivity than the first non-single crystalline oxide semiconductor film;
   etching the first non-single crystalline oxide semiconductor film and the second non-single crystalline oxide semiconductor film to form a first oxide semiconductor layer and a second oxide semiconductor layer on the first oxide semiconductor layer;
   forming a conductive layer over the second oxide semiconductor layer;
   etching the conductive layer to form a source electrode and a drain electrode, wherein part of the second oxide semiconductor layer between the source electrode and the drain electrode is etched so that a thickness of the second oxide semiconductor layer between the source electrode and the drain electrode is smaller than thicknesses of the second oxide semiconductor layer below the source electrode and the drain electrode;
   forming an insulating film comprising silicon over the second oxide semiconductor layer, the source electrode and the drain electrode, wherein an upper surface of the second oxide semiconductor layer between the source electrode and the drain electrode contacts the insulating film; and
   heating the first oxide semiconductor layer and the second oxide semiconductor layer at a temperature of 200° C. or higher after forming the insulating film.

2. The method according to claim 1, wherein each of the first non-single crystalline oxide semiconductor film and the second non-single crystalline oxide semiconductor film is formed by sputtering.

3. The method according to claim 1, wherein each of the first non-single crystalline oxide semiconductor film and the second non-single crystalline oxide semiconductor film further comprises gallium and zinc.

4. The method according to claim 1, wherein a thickness of the first non-single crystalline oxide semiconductor film is 1 to 50 nm.

5. The method according to claim 1, wherein a thickness of the second non-single crystalline oxide semiconductor film is 10 to 300 nm.

6. The method according to claim 1, wherein each of the source electrode and the drain electrode comprises a first titanium layer, a conductive layer on the first titanium layer, and a second titanium layer on the conductive layer, the first titanium layer being in contact with the second oxide semiconductor layer.

7. The method according to claim 1, wherein the first oxide semiconductor layer is thinner than the second oxide semiconductor layer.

8. The method according to claim 1, wherein the second oxide semiconductor layer has a carrier concentration lower than $1 \times 10^{17}$ /cm$^3$.

9. The method according to claim 1, wherein the first oxide semiconductor layer has an electrical conductivity higher than $1 \times 10^{-3}$ S/cm.

10. A method of manufacturing a semiconductor device comprising the steps of:
    forming a gate insulating film over a gate electrode;
    forming a first non-single crystalline oxide semiconductor film comprising indium by sputtering over the gate electrode with the gate insulating film interposed therebetween;
    forming a second non-single crystalline oxide semiconductor film comprising indium by sputtering over the first non-single crystalline oxide semiconductor film successively after forming the first non-single crystalline oxide semiconductor film without exposing the first non-single crystalline oxide semiconductor film to air, the second non-single crystalline oxide semiconductor film having a lower electrical conductivity than the first non-single crystalline oxide semiconductor film;
    etching the first non-single crystalline oxide semiconductor film and the second non-single crystalline oxide semiconductor film to form a first oxide semiconductor layer and a second oxide semiconductor layer on the first oxide semiconductor layer;
    forming a conductive layer over the second oxide semiconductor layer;
    etching the conductive layer to form a source electrode and a drain electrode, wherein part of the second oxide semiconductor layer between the source electrode and the drain electrode is etched so that a thickness of the second oxide semiconductor layer between the source electrode and the drain electrode is smaller than thicknesses of the second oxide semiconductor layer below the source electrode and the drain electrode;
    forming an insulating film comprising silicon over the second oxide semiconductor layer, the source electrode and the drain electrode; and
    heating the first oxide semiconductor layer and the second oxide semiconductor layer at a temperature of 200° C. or higher after forming the insulating film.

11. The method according to claim 10, wherein each of the first non-single crystalline oxide semiconductor film and the second non-single crystalline oxide semiconductor film is formed by sputtering.

12. The method according to claim 10, wherein each of the first non-single crystalline oxide semiconductor film and the second non-single crystalline oxide semiconductor film further comprises gallium and zinc.

13. The method according to claim 10, wherein a thickness of the first non-single crystalline oxide semiconductor film is 1 to 50 nm.

14. The method according to claim 10, wherein a thickness of the second non-single crystalline oxide semiconductor film is 10 to 300 nm.

15. The method according to claim 10, wherein each of the source electrode and the drain electrode comprises a first titanium layer, a conductive layer on the first titanium layer, and a second titanium layer on the conductive layer, the first titanium layer being in contact with the second oxide semiconductor layer.

16. The method according to claim 10, wherein the first oxide semiconductor layer is thinner than the second oxide semiconductor layer.

17. The method according to claim 10, wherein the second oxide semiconductor layer has a carrier concentration lower than $1 \times 10^{17}$ /cm$^3$.

18. The method according to claim 10, wherein the first oxide semiconductor layer has an electrical conductivity higher than $1\times10^{-3}$ S/cm.

19. A method of manufacturing a semiconductor device comprising the steps of:
- forming a gate insulating film over a gate electrode;
- forming a first non-single crystalline oxide semiconductor film comprising indium by sputtering over the gate electrode with the gate insulating film interposed therebetween;
- forming a second non-single crystalline oxide semiconductor film comprising indium by sputtering over the first non-single crystalline oxide semiconductor film, the second non-single crystalline oxide semiconductor film having a lower electrical conductivity than the first non-single crystalline oxide semiconductor film;
- etching the first non-single crystalline oxide semiconductor film and the second non-single crystalline oxide semiconductor film to form a first oxide semiconductor layer and a second oxide semiconductor layer on the first oxide semiconductor layer;
- forming a conductive layer over the second oxide semiconductor layer;
- etching the conductive layer to form a source electrode and a drain electrode, wherein part of the second oxide semiconductor layer between the source electrode and the drain electrode is etched so that a thickness of the second oxide semiconductor layer between the source electrode and the drain electrode is smaller than thicknesses of the second oxide semiconductor layer below the source electrode and the drain electrode;
- forming a first insulating film comprising silicon and oxygen over the second oxide semiconductor layer, the source electrode and the drain electrode;
- forming a second insulating film comprising silicon and nitrogen over the first insulating film; and
- heating the first oxide semiconductor layer and the second oxide semiconductor layer at a temperature of 200° C. or higher after forming the second insulating film,
- wherein an upper surface of the second oxide semiconductor layer between the source electrode and the drain electrode contacts the first insulating film.

20. The method according to claim 19, wherein each of the first non-single crystalline oxide semiconductor film and the second non-single crystalline oxide semiconductor film is formed by sputtering.

21. The method according to claim 19, wherein each of the first non-single crystalline oxide semiconductor film and the second non-single crystalline oxide semiconductor film further comprises gallium and zinc.

22. The method according to claim 19, wherein a thickness of the first non-single crystalline oxide semiconductor film is 1 to 50 nm.

23. The method according to claim 19, wherein a thickness of the second non-single crystalline oxide semiconductor film is 10 to 300 nm.

24. The method according to claim 19, wherein each of the source electrode and the drain electrode comprises a first titanium layer, a conductive layer on the first titanium layer, and a second titanium layer on the conductive layer, the first titanium layer being in contact with the second oxide semiconductor layer.

25. The method according to claim 19, wherein the first oxide semiconductor layer is thinner than the second oxide semiconductor layer.

26. The method according to claim 19, wherein the second oxide semiconductor layer has a carrier concentration lower than $1\times10^{17}$/cm$^3$.

27. The method according to claim 19, wherein the first oxide semiconductor layer has an electrical conductivity higher than $1\times10^{-3}$ S/cm.

28. A method for manufacturing a semiconductor device comprising:
- forming a gate electrode layer over a substrate;
- forming a gate insulating film over the gate electrode layer;
- forming an oxide semiconductor layer over the gate electrode layer with the gate insulating film therebetween, the oxide semiconductor layer including a first oxide semiconductor film and a second oxide semiconductor film on the first oxide semiconductor film, wherein the second oxide semiconductor film has a lower electrical conductivity than the first oxide semiconductor film;
- forming a source electrode layer and a drain electrode layer over and in electrical contact with the oxide semiconductor layer; and
- forming an insulating layer over the source electrode layer and the drain electrode layer, wherein the insulating layer is in contact with a portion of the second oxide semiconductor film between the source electrode layer and the drain electrode layer,
- wherein each of the first oxide semiconductor film and the second oxide semiconductor film contains indium, gallium, and zinc,
- wherein formation of the first oxide semiconductor film includes a step of sputtering in a first oxygen containing atmosphere,
- wherein formation of the second oxide semiconductor film includes a step of sputtering in a second oxygen containing atmosphere, and
- wherein a proportion of a flow rate of an oxygen gas in the first oxygen containing atmosphere is lower than a proportion of a flow rate of an oxygen gas in the second oxygen containing atmosphere.

29. The method according to claim 28, wherein an upper portion of the second oxide semiconductor film between the source electrode layer and the drain electrode layer is etched so that a thickness of the second oxide semiconductor film is smaller at the portion between the source electrode layer and the drain electrode layer than portions below the source electrode layer and the drain electrode layer.

30. The method according to claim 28, wherein the insulating layer comprises silicon oxide.

31. The method according to claim 28, wherein the insulating layer comprises silicon oxynitride.

* * * * *